(12) United States Patent
Ogihara et al.

(10) Patent No.: US 9,312,144 B2
(45) Date of Patent: Apr. 12, 2016

(54) COMPOSITION FOR FORMING A SILICON-CONTAINING RESIST UNDER LAYER FILM AND PATTERNING PROCESS

(71) Applicant: SHIN-ETSU CHEMICAL CO., LTD., Tokyo (JP)

(72) Inventors: Tsutomu Ogihara, Jyoetsu (JP); Yusuke Biyajima, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/335,514

(22) Filed: Jul. 18, 2014

(65) Prior Publication Data

US 2015/0093901 A1 Apr. 2, 2015

(30) Foreign Application Priority Data

Oct. 2, 2013 (JP) .................................. 2013-207169

(51) Int. Cl.

| | |
|---|---|
| *C07F 7/18* | (2006.01) |
| *H01L 21/308* | (2006.01) |
| *G03F 7/11* | (2006.01) |
| *H01L 21/3213* | (2006.01) |
| *C09D 183/04* | (2006.01) |
| *C08L 83/04* | (2006.01) |
| *C08G 77/04* | (2006.01) |
| *C08G 77/18* | (2006.01) |

(52) U.S. Cl.
CPC ............. *H01L 21/3086* (2013.01); *C08L 83/04* (2013.01); *C09D 183/04* (2013.01); *G03F 7/11* (2013.01); *H01L 21/3081* (2013.01); *H01L 21/3085* (2013.01); *H01L 21/32139* (2013.01); *C08G 77/045* (2013.01); *C08G 77/18* (2013.01)

(58) Field of Classification Search
USPC .......................................... 556/450, 457, 462
See application file for complete search history.

(56) References Cited

U.S. PATENT DOCUMENTS

| | | | |
|---|---|---|---|
| 5,632,910 A | 5/1997 | Nagayama et al. | |
| 2006/0211271 A1 | 9/2006 | Weigel et al. | |
| 2007/0238300 A1 | 10/2007 | Ogihara et al. | |
| 2009/0136869 A1 | 5/2009 | Ogihara et al. | |
| 2010/0285407 A1 | 11/2010 | Ogihara et al. | |

FOREIGN PATENT DOCUMENTS

| | | | | |
|---|---|---|---|---|
| EP | 2 599 819 A1 | 6/2013 | | |
| JP | A-H07-181688 | 7/1995 | | |
| JP | A-H07-183194 | 7/1995 | | |
| JP | 2000-356854 | * 12/2000 | ................ | G03F 7/11 |
| JP | A-2001-040094 | 2/2001 | | |
| JP | A-2004-157469 | 6/2004 | | |
| JP | A-2004-191386 | 7/2004 | | |
| JP | A-2005-520354 | 7/2005 | | |
| JP | A-2007-302873 | 11/2007 | | |
| JP | A-2009-126940 | 6/2009 | | |
| JP | B2-4716037 | 7/2011 | | |
| JP | B2-5038354 | 10/2012 | | |
| TW | 201327061 A | 7/2013 | | |
| WO | WO 2004/007192 A1 | 1/2004 | | |

OTHER PUBLICATIONS

Extended European Search Report issued in Application No. 14003161.8 dated Nov. 5, 2014.
Nakamura et al., "Contact Hole Formation by Multiple Exposure Technique in Ultra-low $k_1$ Lithography," *Proceedings of SPIE*, 2004, pp. 255-263, vol. 5377, SPIE, Bellingham, WA.
Jul. 23, 2015 Office Action issued in Taiwanese Application No. 103133972.

* cited by examiner

*Primary Examiner* — Sudhakar Katakam
*Assistant Examiner* — Pancham Bakshi
(74) *Attorney, Agent, or Firm* — Oliff PLC

(57) ABSTRACT

A composition for forming a silicon-containing resist under layer film includes a silicon-containing compound which is obtained by hydrolysis, condensation or hydrolysis-condensation of a second silicon compound containing one or more compounds represented by the following general formula (1),

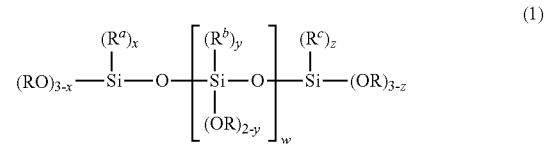

(1)

wherein R represents an organic group having 1 to 6 carbon atoms, $R^a$, $R^b$ and $R^c$ each represents a substituted or unsubstituted monovalent organic group having 1 to 30 carbon atoms, w=0 or 1, x=0, 1, 2 or 3, y=0, 1 or 2, z=0, 1, 2 or 3; when w=0, 5≥x+z≥1, and the case where (x, z)=(1, 1), (3, 0) or (0, 3) are not included; and when w=1, 7≥x+y+z≥1, and the case where (x, y, z)=(1, 1, 1) is not included. The composition forms a resist under layer film with extremely less number of coating defects, and excellent adhesiveness in fine pattern and etching selectivity.

4 Claims, No Drawings

COMPOSITION FOR FORMING A SILICON-CONTAINING RESIST UNDER LAYER FILM AND PATTERNING PROCESS

BACKGROUND OF THE INVENTION

1. Field of the Invention

The present invention relates to a composition for forming a silicon-containing resist under layer film used in a multilayer resist method used for fine processing in a step for producing a semiconductor device, and a patterning process using the same.

2. Description of the Related Art

In the 1980s, exposure light whose source is g-beam (436 nm) or i-beam (365 nm) of a mercury lamp was commonly used for resist patterning. To achieve a further micro resist pattern, a method for making exposure wavelength shorter has been regarded as more effective means. In the 1990s, 64 MB (work size: 0.25 µm or less) dynamic random access memory (DRAM) were mass produced, in which short-wavelength KrF excimer laser (248 nm) were employed as an exposure source instead of the i-beam (365 nm). However, the production of DRAMs with an integration degree of 256 MB and 1 GB or more requires finer processing technology (work size: 0.2 µm or less), and needs a light source of shorter wavelength. Amid this technological need, the introduction of photolithography using ArF excimer laser (193 nm) has been seriously studied since about a decade ago. According to initial strategy, ArF lithography was going to be introduced in conjunction with the production of 180 nm-node devices, but a conventional KrF excimer lithography was continuously used until 130 nm-node device mass production. Therefore, official introduction of ArF lithography started with 90 nm-node device production. Meanwhile, mass production of 65 nm-node devices are being promoted by combining with lenses whose numerical aperture (NA) was raised to 0.9. Because of advantageous shorter exposure wavelength, $F_2$ lithography with wavelength of 157 nm was regarded as a next promising production technology for subsequent 45 nm-node devices. However, development of $F_2$ lithography was canceled due to several problems such as higher scanner costs from expensive $CaF_2$ single crystals into projection lenses in large volumes, change in the optical system in accordance with introduction of hard pellicles instead of conventional extremely low durable soft pellicles, and reduced etch resistance of a resist film, thereby introducing ArF-immersion lithography. In the ArF-immersion lithography, water with a refractive index of 1.44 is inserted between a projection lens and a wafer by partial fill method, enabling high-speed scanning. Accordingly, 45 nm-node devices are mass produced by using lenses with an NA of 1.3.

Extreme-ultraviolet (EUV) lithography with wavelength of 13.5 nm is regarded as a next promising fine processing technology by using 32 nm-node lithography. Unfortunately, the EUV lithography is prone to numerous technical problems such as needs for higher laser output, higher sensitivity of a resist film, higher resolution, lower line edge roughness (LER), use of defect-free MoSi laminated mask, and lower aberration of a reflective mirror. Development of another promising 32 nm-node device production technology, high-refractive index immersion lithography, was canceled due to low transmission factor of another promising high-refractive index lens (LUAG) and an inability to obtain a target value of a liquid's refractive index at 1.8. Under the circumstances, general-purpose light exposure technology seems to fail to significantly improve the resolution unless a light source wavelength is changed.

Accordingly, development of a fine processing technology for obtaining a work size exceeding a limiting resolution of an existing ArF-immersion exposure technology has been promoted. As a technology thereof, double patterning technology is being proposed. Specifically, the double patterning technology is a method (method (1)) for forming a first photoresist pattern with an interval rate of a line to a space of 1:3 by using first exposure and development, processing an under layer hard mask by dry etching, laying another hard mask thereon, forming a second line pattern at a space portion obtained by the first exposure by using second exposure and development of a photoresist film, processing the hard mask by dry etching, to form the first pattern and the second pattern alternately. By this method, it is possible that forming a line and space pattern whose pitch is half that of an exposure pattern. Also, there is another method (method (2)) for forming a first photoresist pattern with an interval rate of a line to a space of 3:1 by using first exposure and development, processing an under layer hard mask by dry etching, forming a pattern on a remaining portion of the hard mask by using second exposure by applying a photoresist film on the under layer hard mask, and processing the hard mask by dry etching with the pattern as a mask. In both methods, by processing a hard mask by two dry etching, a pattern whose pitch is half that of an exposure pattern can be formed. Nevertheless, while the method (1) requires formation of a hard mask twice, the method (2) needs one-time hard mask formation, but formation of a trench pattern which is more difficult to resolve than a line pattern.

Another method (method (3)) proposed is to form a line pattern on a positive resist film in X direction by using a dipole light, cure a resist pattern, apply a resist composition thereon again, expose a line pattern in Y direction by using a dipole light, and form a hole pattern from a gap of a grid-like line pattern (Non-Patent Document 1). Moreover, a method for halving a pitch by one-time pattern exposure by using spacer technology in which a resist pattern, an organic hard mask or a polysilicon film whose pattern is transferred and is regarded as a core pattern, and the core pattern is removed by using dry etching, after forming a silicon oxide film around the core pattern at a low temperature, is being proposed.

As mentioned above, finer patterning is difficult only by the upper layer resist, and finer patterning process cannot be established unless a hard mask formed under the upper layer resist is utilized. Under such a circumstance, there is a multilayer resist method as one of the methods to utilize the hard mask as a resist under layer film. In this method, an intermediate film having etching selectivity different from that of a photoresist film, i.e. a resist upper layer film, for example, a silicon-containing resist under layer film is interposed between the resist upper layer film and a substrate to be processed, a pattern is formed to the resist upper layer film, and then, using the upper layer resist pattern as a dry etching mask, the pattern is transferred to the resist under layer film by dry etching, and further using the resist under layer film as a dry etching mask, the pattern is transferred to a substrate to be processed or a film which becomes a core for a spacer process by dry etching.

As a material to be used for such a multilayer resist method, a composition for forming a silicon-containing film has been well known. There are, for example, a silicon-containing inorganic film formed by a CVD method such as a $SiO_2$ film (for example, Patent Document 1, etc.) and a SiON film (for example, Patent Document 2, etc.), and as a material which can be obtained by spin-coating, there are a SOG (spin-onglass) film (for example, Patent Document 3, etc.) and a cross-linkable silsesquioxane film (for example, Patent Document 4, etc.), etc.

Until now, a resist under layer film which can be used for the multilayer resist method has been investigated, and a composition for forming a silicon-containing resist under layer film as shown in Patent Document 5 or Patent Document 6, etc., has been disclosed. However, in the semiconductor apparatus manufacturing process which exceeds the limit of resolution of the ArF liquid immersion lithography in recent years, a complicated process such as the above-mentioned double patterning, etc., has been proposed. In such a process, a number of lithography processes or a number of processing steps by dry etching is acceleratingly increased; thereby improvement in precision of pattern transferring in the respective coating films has been required. Under such a circumstance, generation of defects in pattern transferring due to the presence of defects in the coated film (coating defects), and lowering in yield thereby becomes a problem. Accordingly, for constructing more rational manufacturing process of a semiconductor apparatus, a composition capable of forming a coating film having less number of defects to the limit for the organic film or the silicon-containing film which is at present practically used has been required.

PRIOR ART DOCUMENTS

Patent Documents

Patent Document 1: Japanese Patent Laid-Open Publication No. H07-183194

Patent Document 2: Japanese Patent Laid-Open Publication No. H07-181688

Patent Document 3: Japanese Patent Laid-Open Publication No. 2007-302873

Patent Document 4: Japanese Patent Laid-Open Publication No. 2005-520354

Patent Document 5: Japanese Patent No. 4716037 Patent Document 6: Japanese Patent No. 5038354

Non-Patent Document

Non-Patent Document 1: Proc. SPIE Vol. 5377 p 255 (2004)

SUMMARY OF THE INVENTION

The present invention has been accomplished to solve the above-mentioned problems, and an object thereof is to provide a composition for forming a silicon-containing resist under layer film which is to form a resist under layer film with extremely less number of coating defect, and excellent in adhesiveness in fine pattern and etching selectivity.

To solve the above-mentioned problems, the present invention provides a composition for forming a silicon-containing resist under layer film which comprises a silicon-containing compound ($A_1$) which is obtained by hydrolysis, condensation or hydrolysis-condensation of a silicon compound (A-1) containing one or more compounds represented by the following general formula (1),

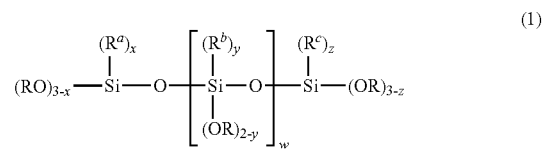

wherein R represents an organic group having 1 to 6 carbon atoms, $R^a$, $R^b$ and $R^c$ each represents a substituted or unsubstituted monovalent organic group having 1 to 30 carbon atoms, w=0 or 1, x=0, 1, 2 or 3, y=0, 1 or 2, z=0, 1, 2 or 3; when w=0, 5≥x+z≥1, and the case where (x, z)=(1, 1), (3, 0) or (0, 3) are not included; and when w=1, 7≥x+y+z≥1, and the case where (x, y, z)=(1, 1, 1) is not included.

When such a composition for forming a silicon-containing resist under layer film is employed, a resist under layer film with extremely less number of coating defects, and excellent in adhesiveness in fine pattern and etching selectivity can be formed.

Among these, the above-mentioned silicon-containing compound ($A_1$) is preferably obtained by hydrolysis, condensation or hydrolysis-condensation of a mixture of the above-mentioned silicon compound (A-1) and one or more silicon compounds (A-2) represented by the following general formula (2),

wherein R has the same meaning as defined above.

When such a silicon-containing compound is employed, a resist under layer film excellent in adhesiveness in fine pattern and etching selectivity can be formed.

In addition, the composition for forming a silicon-containing resist under layer film preferably further contains a silicon-containing compound ($A_2$) obtained by hydrolysis, condensation or hydrolysis-condensation of one or more silicon compound (A-2) represented by the following general formula (2),

wherein R has the same meaning as defined above.

When such a composition for forming a silicon-containing resist under layer film is employed, a resist under layer film further excellent in adhesiveness in fine pattern and etching selectivity can be formed.

Also, the present invention provides a patterning process which comprises the steps of:

forming an organic under layer film on a body to be processed using a coating type organic under layer film material;

forming a silicon-containing resist under layer film on the organic under layer film using the above-mentioned composition for forming a silicon-containing resist under layer film;

forming an upper layer resist film on the silicon-containing resist under layer film using an upper layer resist film composition;

forming an upper layer resist pattern to the upper layer resist film;

transferring the pattern to the silicon-containing resist under layer film by etching using the upper layer resist pattern as a mask;

transferring the pattern to the organic under layer film by etching using the silicon-containing resist under layer film to which the pattern has been transferred as a mask; and further transferring the pattern to the body to be processed by etching using the organic under layer film to which the pattern has been transferred as a mask.

Further, the present invention provides a patterning process which comprises the steps of:

forming an organic hard mask mainly comprising carbon on a body to be processed by a CVD method;

forming a silicon-containing resist under layer film on the organic hard mask using the above-mentioned composition for forming a silicon-containing resist under layer film;

forming an upper layer resist film on the silicon-containing resist under layer film using an upper layer resist film composition;

forming an upper layer resist pattern to the upper layer resist film;

transferring the pattern to the silicon-containing resist under layer film by etching using the upper layer resist pattern as a mask;

transferring the pattern to the organic hard mask by etching using the silicon-containing resist under layer film to which the pattern has been transferred as a mask; and further transferring the pattern to the body to be processed by etching using the organic hard mask to which the pattern has been transferred as a mask.

Such a patterning process is employed, coating defects of the silicon-containing resist under layer film are reduced, and pattern adhesiveness or etching selectivity is excellent, so that fine pattern can be transferred to the body to be processed without defect, and yield can be improved.

At this time, it is preferred to use, as the body to be processed, a semiconductor substrate, or a material in which any of a metal film, a metal carbide film, a metal oxide film, a metal nitride film, a metal oxycarbide film or a metal oxynitride film is formed on the semiconductor substrate.

Moreover, a metal constituting the above-mentioned body to be processed is preferably silicon, titanium, tungsten, hafnium, zirconium, chromium, germanium, copper, aluminum, indium, gallium, arsenic, palladium, iron, tantalum, iridium, molybdenum, or an alloy thereof.

In the present invention, a pattern can be formed using such a material as a body to be processed.

At this time, as the method of forming the above-mentioned upper layer resist pattern, it is preferred to use any of the methods of a lithography method using light with a wavelength of 300 nm or less or EUV light, an electron beam direct drawing method, an directed self-assembly method and a nano-imprinting lithography method.

When such a method is employed, a fine pattern can be formed to the upper layer resist film.

When the composition for forming a silicon-containing resist under layer film of the present invention is used, in an etching process of the manufacturing process of an extremely fine semiconductor apparatus, a silicon-containing resist under layer film having extremely less number of coating defects, and excellent in pattern adhesiveness and etching selectivity, i.e., a silicon-containing resist under layer film having a less number of defects in pattern transferring after etching can be formed. Moreover, when such a silicon-containing resist under layer film is used in a patterning process, finally an organic under layer film or an organic hard mask is processed by using a silicon-containing resist under layer film to which an upper layer resist pattern has been transferred as an etching mask, and further using the same as an etching mask, a body to be processed can be processed without defects and with high precision, whereby yield can be improved.

DETAILED DESCRIPTION OF THE PREFERRED EMBODIMENTS

As one of starting materials of a silicon-containing compound contained in a composition for forming a silicon-containing resist under layer film, a silicon-containing monomer having the structure represented by the following general formula have heretofore been used, and particularly a compound containing an aromatic ring as an organic group (R) has been used as a light absorbing compound for preventing reflection in a lithography process.

R—Si(OR')$_3$ wherein R represents an organic group and R' represents a hydrocarbon group.

However, in fact, it is rare that the above-mentioned compound is used alone as a silicon-containing compound contained in the composition for forming a silicon-containing resist under layer film, and in general, a hydrolysis-condensate obtained by hydrolysis-condensation reaction of a mixture of the above-mentioned compound with a monomer having an alkyl group or an organic group containing a reactive group such as lactone, ester, epoxy, etc. as an organic group (R), and/or with tetraalkoxy silanes, has been used. However, a cage compound represented by the following formula is generated at this time due to the effects of difference in reactivity of the respective monomer or stability of the product, etc., and generation thereof is stochastically inevitable.

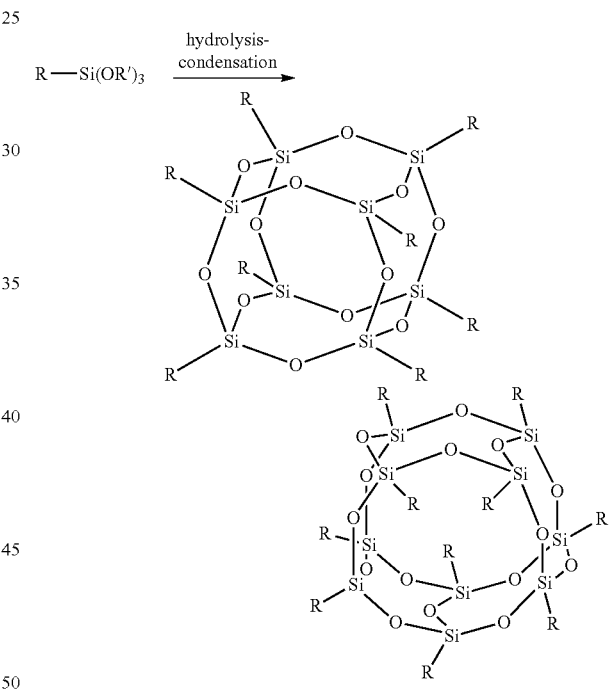

The cage compound as mentioned above is also generated in manufacturing the conventional silicon-containing compound with an extremely minute amount, and exists as minute coating defects, but it did not obviously affect lowering in yield in the semiconductor apparatus manufacturing process so far. However, accompanying with the progress of miniaturization in semiconductor apparatus manufacturing process, by presenting the cage compound as mentioned above in a coated film as minute coating defects, defects are generated in pattern transferring by etching; whereby it has been obvious that the cage compound affects lowering yield after etching.

The inventors of the present invention have earnestly investigated on a silicon-containing compound which does not generate such a cage compound, and a composition for forming a silicon-containing resist under layer film which does not cause lowering in yield in the etching process of the manufacturing process of an extremely fine semiconductor apparatus by using the above-mentioned silicon-containing compound; and as a result, they have found out that a silicon-containing compound having a specific structure can make a number of cage compounds, i.e. a number of coating defects extremely small, whereby they have accomplished the present invention.

That is, the present invention is a composition for forming a silicon-containing resist under layer film which comprises a silicon-containing compound ($A_1$) which is obtained by hydrolysis, condensation or hydrolysis-condensation of a silicon compound (A-1) containing one or more compounds represented by the following general formula (1),

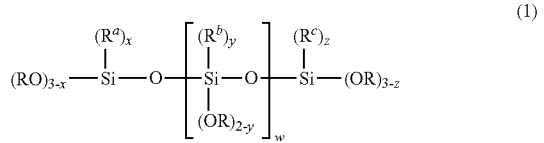

(1)

wherein R represents an organic group having 1 to 6 carbon atoms, $R^a$, $R^b$ and $R^c$ each represents a substituted or unsubstituted monovalent organic group having 1 to 30 carbon atoms, w=0 or 1, x=0, 1, 2 or 3, y=0, 1 or 2, z=0, 1, 2 or 3; when w=0, 5≥x+z≥1, and the case where (x, z)=(1, 1), (3, 0) or (0, 3) are not included; and when w=1, 7≥x+y+z≥1, and the case where (x, y, z)=(1, 1, 1) is not included.

Silicon-Containing Compound ($A_1$)

The silicon-containing compound ($A_1$) to be used in the present invention contains the silicon compound (A-1) including the compound represented by the above-mentioned formula (1) as a monomer. As the compound represented by the above-mentioned formula (1), there may be specifically exemplified by the compounds having the structures represented by the general formulae enumerated below. At this time, it is possible to bond a hydrolyzable group(s): OR on the silicon atom with a number of the valence of the silicon atom, and specific examples of R includes a methyl group, an ethyl group, a n-propyl group, an iso-propyl group, a n-butyl group, an iso-butyl group, a sec-butyl group, a tert-butyl group, a n-pentyl group, a cyclopentyl group, a n-hexyl group, a cyclohexyl group, a phenyl group. Incidentally, $R^1$ in the following general formulae is a tertiary alkyl group.

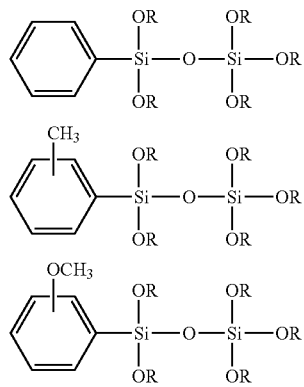

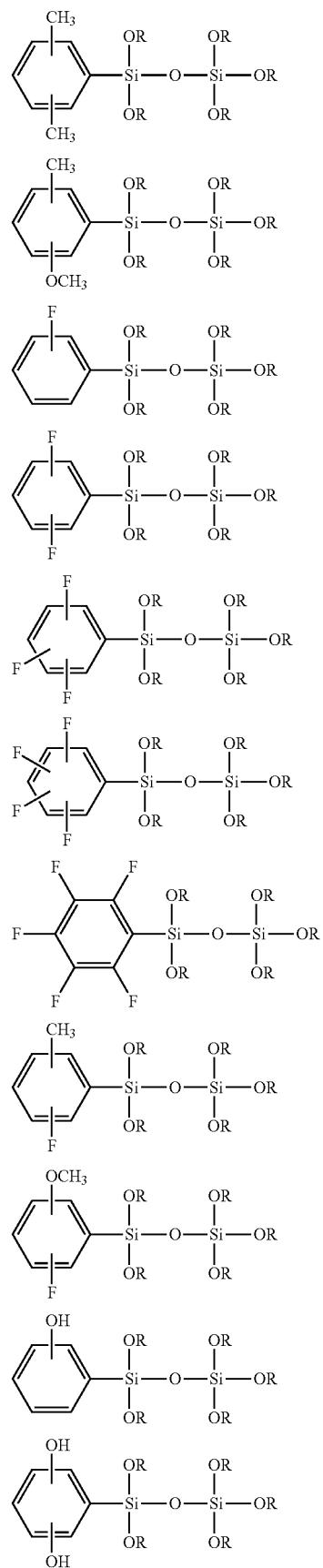

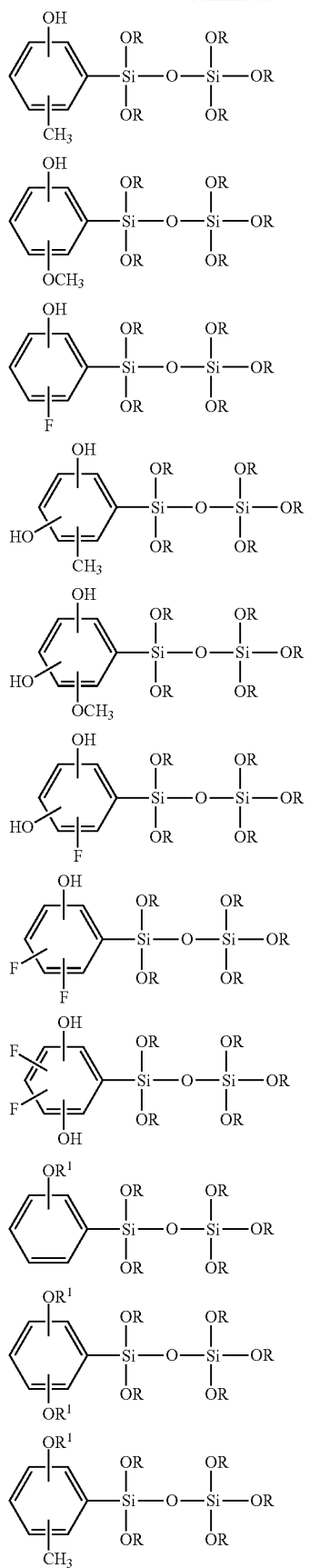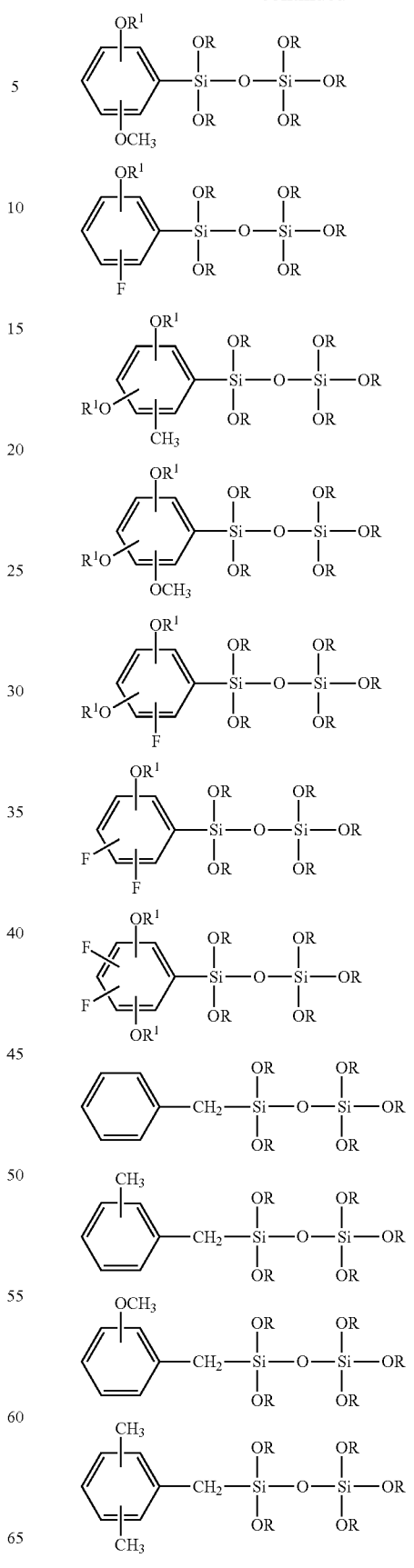

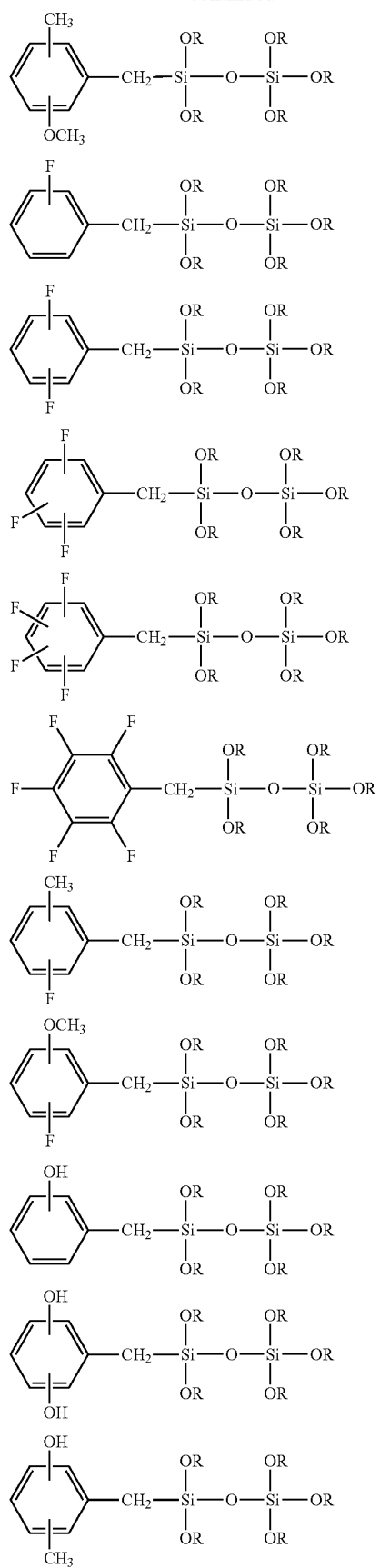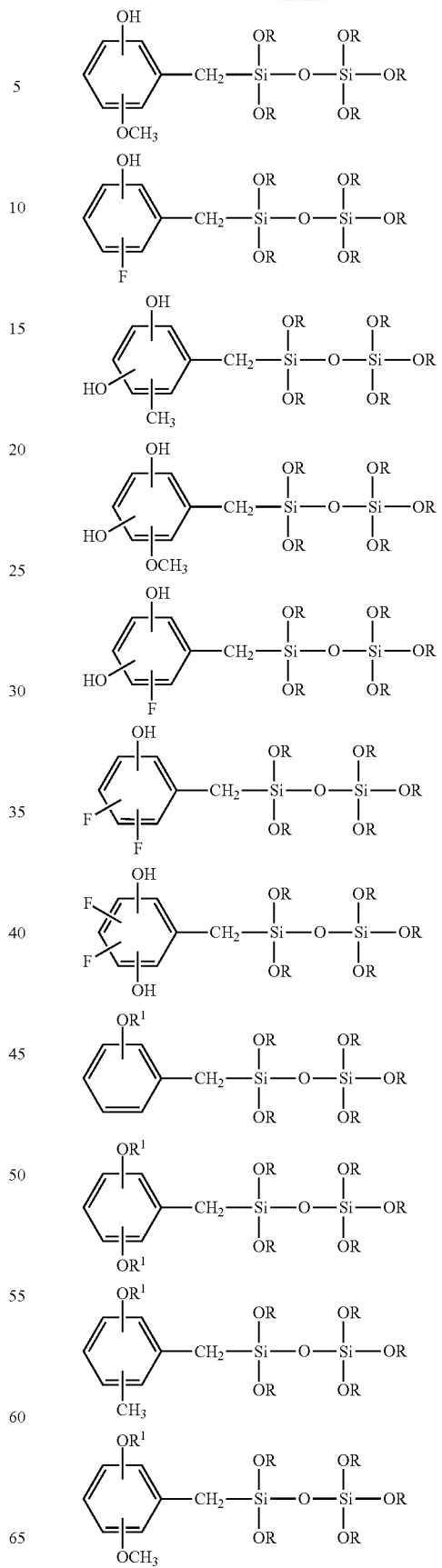

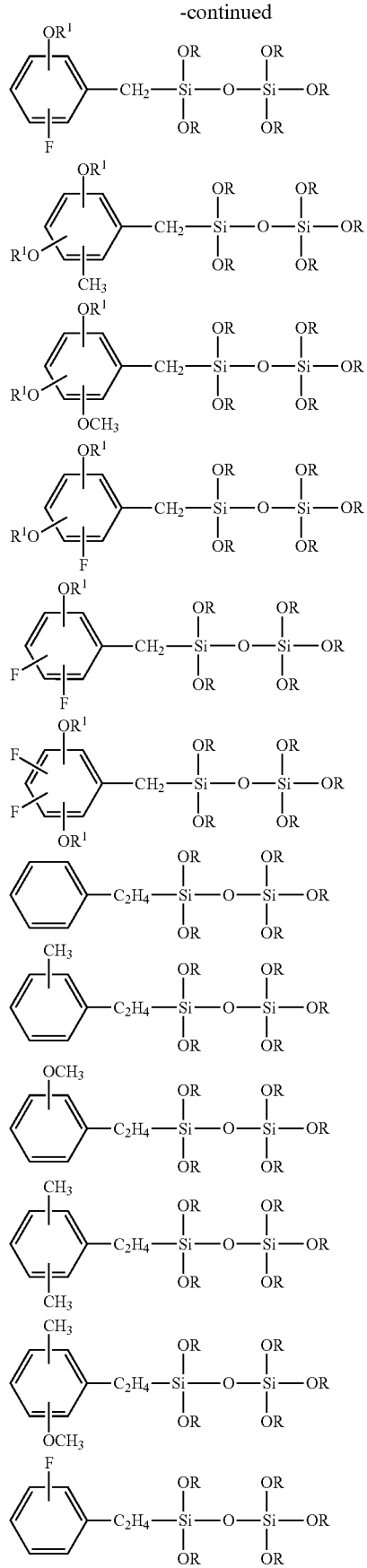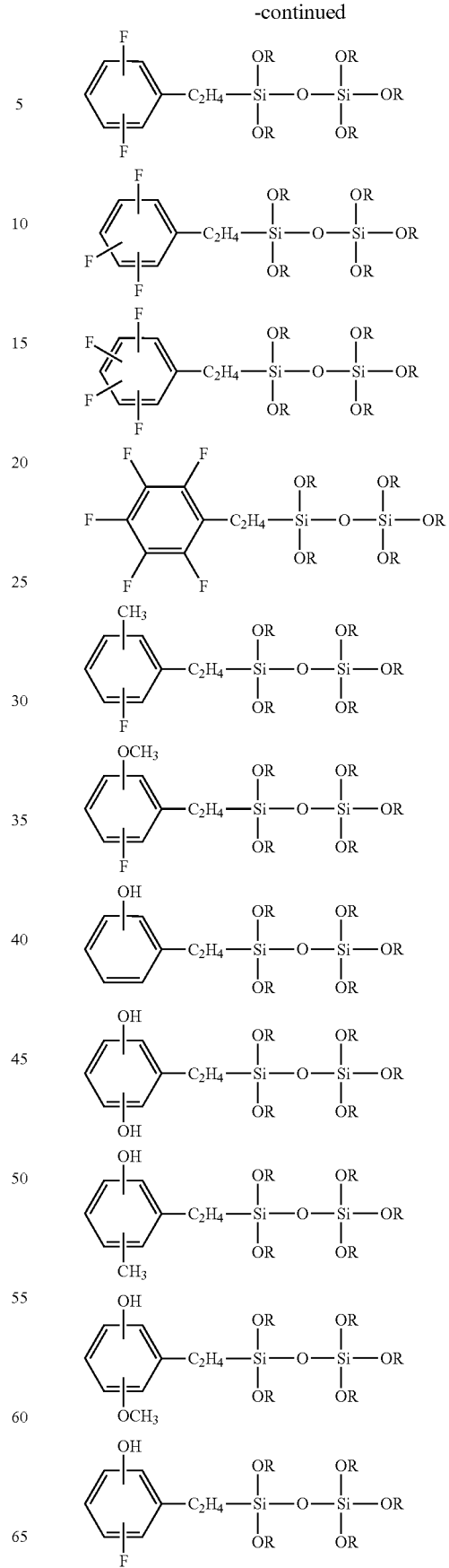

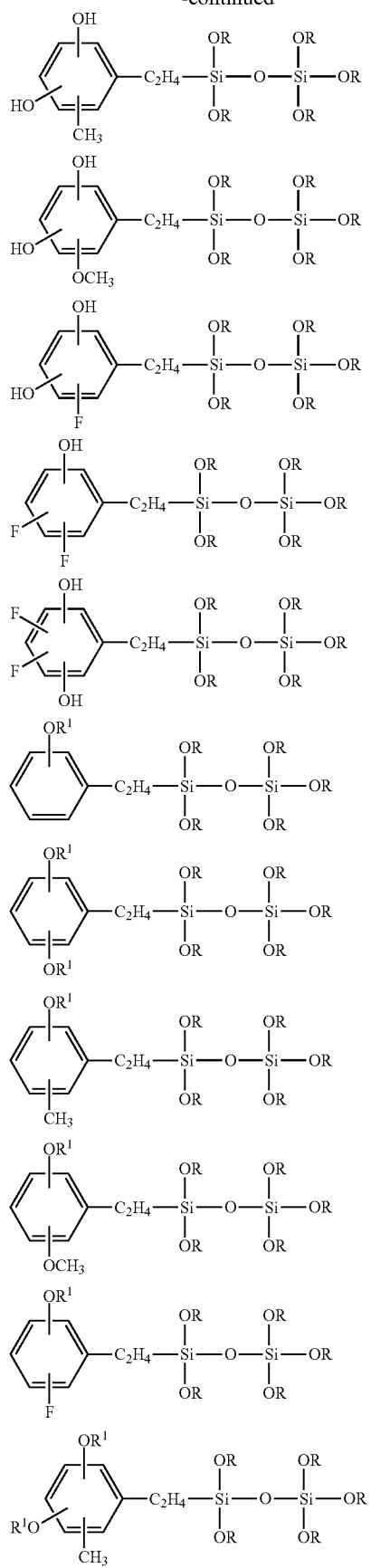
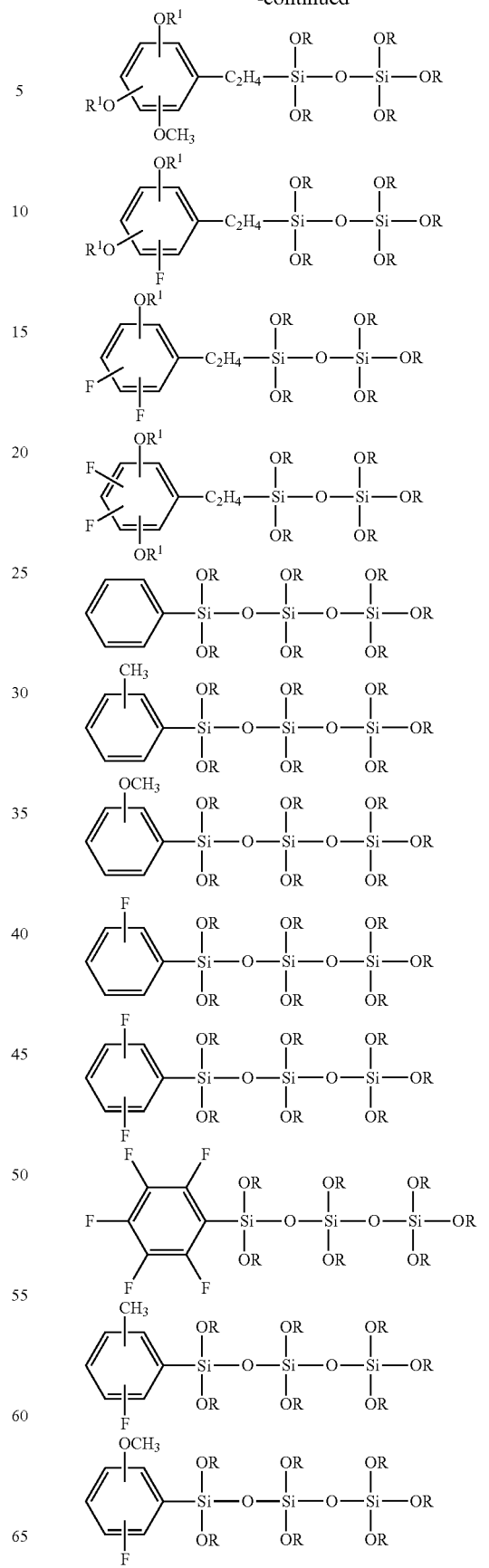

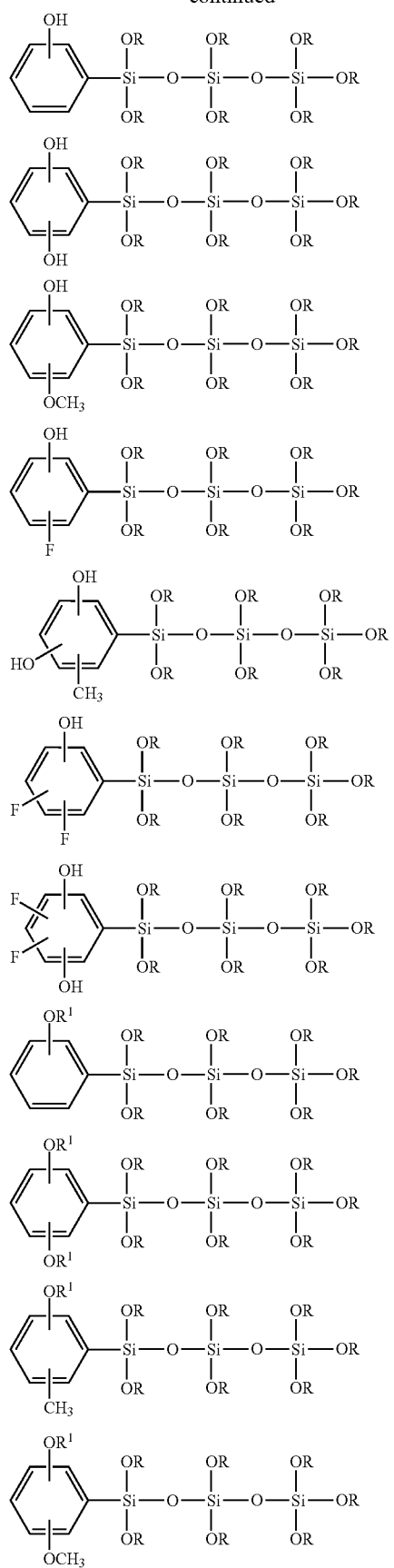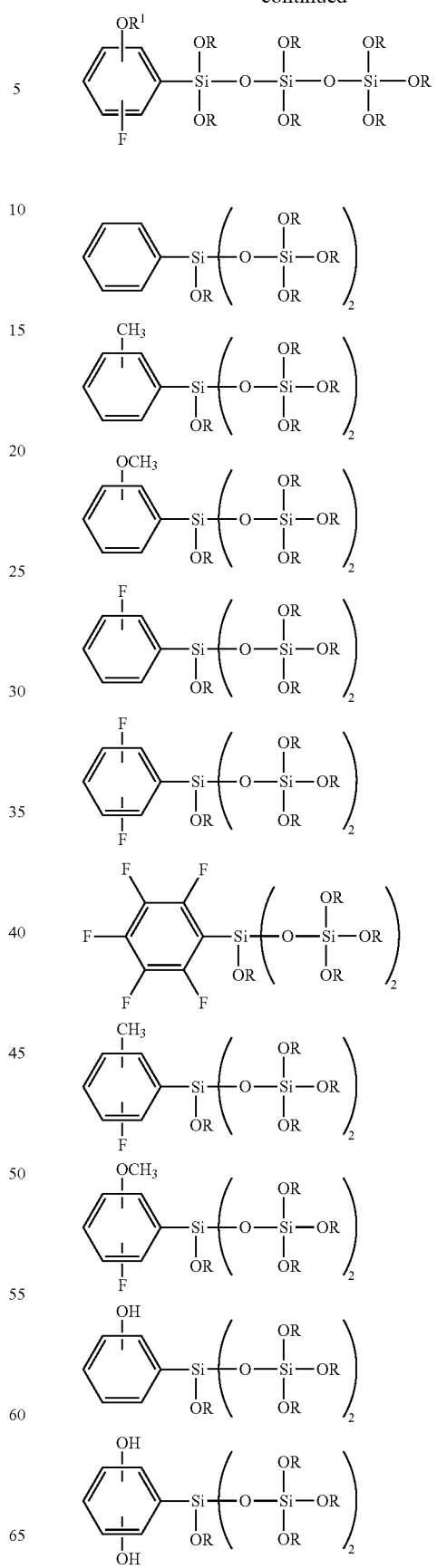

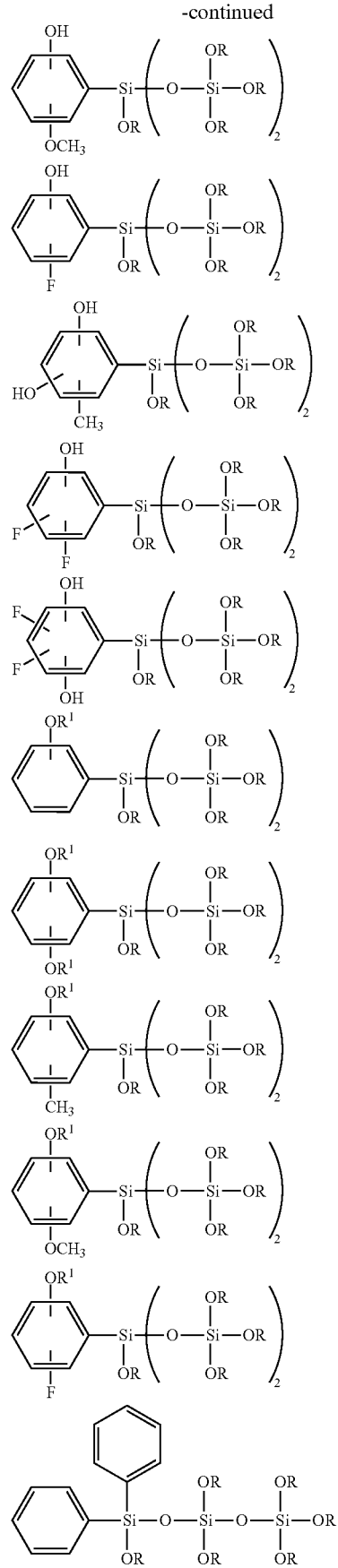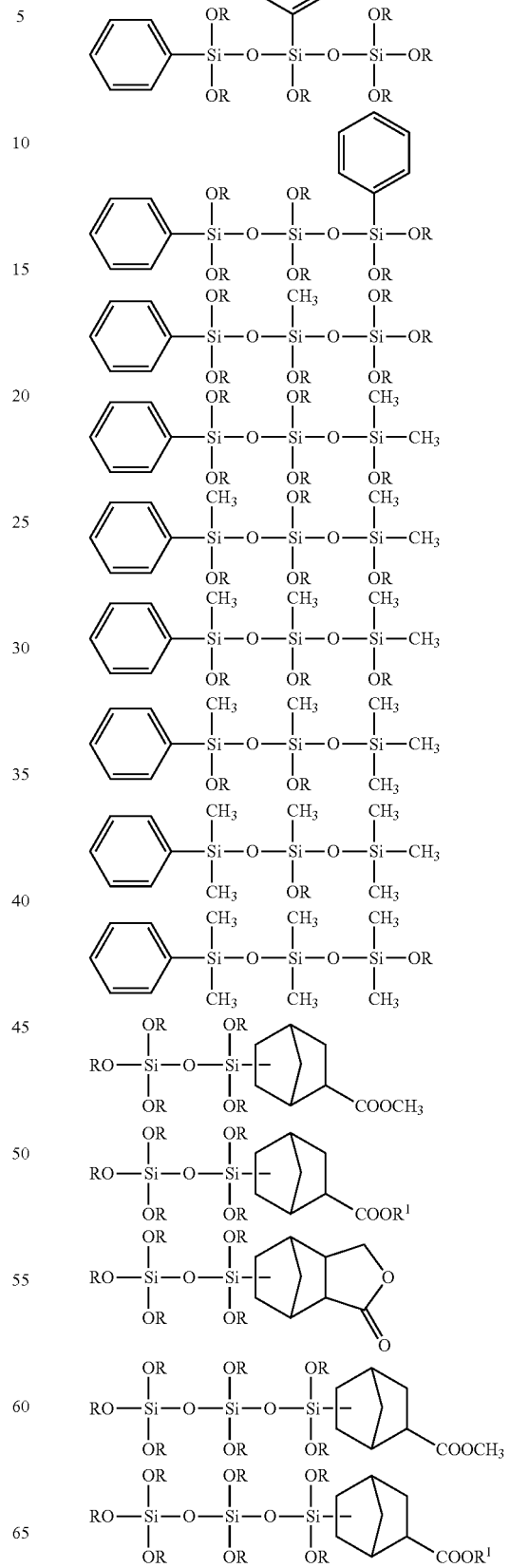

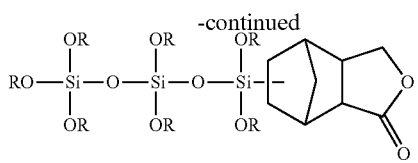

The silicon-containing compound (A$_1$) to be used in the present invention comprises the silicon compound (A-1) containing the above-mentioned compounds as a primary monomer. Such a silicon compound can be polymerized while suppressing generation of the cage compounds. Therefore, when a composition for forming a silicon-containing resist under layer film containing the above-mentioned silicon-containing compound is formed as a film, a number of coating defects can be made extremely small.

Also, the silicon-containing compound (A$_1$) can contain the silicon compound (A-2) represented by the following general formula (2) as a monomer,

wherein R has the same meaning as defined above.

Illustrative example of the silicon compound (A-2) represented by the above-mentioned formula (2) includes tetramethoxy silane, tetraethoxy silane, tetrapropoxy silane, tetraisopropoxy silane, tetrabutoxy silane, tetraphenoxy silane, tetraacetoxy silane, etc. When such a silicon compound is further added and the reaction is carried out, pattern adhesiveness and etching selectivity can be made more excellent.
Silicon-Containing Compound (A$_2$)

In the present invention, a silicon-containing compound (A$_2$) which is obtained by hydrolysis, condensation or hydrolysis-condensation of one or more silicon compounds (A-2) represented by the above-mentioned general formula (2) may be further contained. That is, the composition for forming a silicon-containing resist under layer film of the present invention may be a material containing both of the silicon-containing compounds (A$_1$) and the silicon-containing compound (A$_2$). The silicon-containing compound (A$_2$) may contain the silicon compound (A-2) represented by the above-mentioned formula (2) as a monomer, and the specific materials thereof may be exemplified by the same materials as mentioned above.

Thus, by further containing the silicon-containing compound (A$_2$), when the composition for forming a silicon-containing resist under layer film is formed as a film, pattern adhesiveness and etching selectivity can be made further excellent.

By selecting one or more monomers mentioned above, and mixing them before the reaction or during the reaction to use them as starting materials, whereby the silicon-containing compounds (A$_1$, A$_2$) can be produced.

The silicon-containing compounds can be produced by hydrolysis and/or condensation of the above monomers by using one or more kinds of compounds selected from inorganic acid, aliphatic sulfonic acid, and aromatic sulfonic acid as acid catalyst.

Illustrative example of the acid catalyst used includes hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst is used in the range of $1\times10^{-6}$ to 10 moles, preferably $1\times10^{-5}$ to 5 moles, and more preferably $1\times10^{-4}$ to 1 mole, per mole of a monomer(s).

The amount of water for obtaining a silicon-containing compound by hydrolysis and/or condensation of these monomers is preferably in the range of 0.01 to 100 moles, more preferably 0.05 to 50 moles, and much more preferably 0.1 to 30 moles, per mole of a hydrolyzable substituent bonded to the monomer. If the amount is 100 moles or less, a device used for the reaction becomes smaller and more economical.

In operation, a monomer(s) is/are added to a catalyst aqueous solution to start hydrolysis and condensation reaction. Organic solvent may be added to the catalyst aqueous solution, and a monomer(s) may be diluted with the organic solvent, or both may be performed. The reaction temperature is preferably in the range of 0 to 100° C., and more preferably 5 to 80° C. A method for maintaining the temperature at 5 to 80° C. when a monomer is dropped and then aging the mixture at 20 to 80° C. is preferable.

Illustrative example of the organic solvent that can be added to a catalyst aqueous solution or can dilute a monomer(s) includes methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone and mixture thereof.

Illustrative example of these solvent includes water-soluble solvent, e.g., alcohol such as methanol, ethanol, 1-propanol, and 2-propanol; polyvalent alcohol such as ethylene glycol and propylene glycol; polyvalent alcohol condensate derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; and tetrahydrofuran. Particularly preferable is solvent with a boiling point of 100° C. or less.

The amount of the organic solvent used is preferably in the range of 0 to 1,000 ml, and particularly 0 to 500 ml, per mole of a monomer(s). A smaller amount of the organic solvent used (1,000 ml or less) can make a reaction container smaller and more economical.

Then, if necessary, the catalyst is subjected to neutralization reaction and alcohol produced by hydrolysis-condensation reaction is removed under reduced pressure to obtain a reaction mixture aqueous solution. The amount of an alkaline substance to be used for neutralization is preferably in the range of 0.1 to 2 equivalent weight, relative to acid used as the catalyst. The alkaline substance may be optionally selected if it is alkaline in water.

Subsequently, it is preferable that a by-product such as alcohol produced by hydrolysis-condensation reaction from the reaction mixture be removed under reduced pressure. The temperature for heating the reaction mixture is preferably in the range of 0 to 100° C., more preferably 10 to 90° C., and much more preferably 15 to 80° C., though it is depending on the kinds of the organic solvent added and the alcohol produced by reaction. The decompression degree is preferably an atmospheric pressure or less, more preferably 80 kPa or less in the absolute pressure, and much more preferably 50 kPa or less in the absolute pressure, though it is depending on the kinds of the organic solvent and the alcohol to be removed, of an exhausting equipment, and of an condensing apparatus as well as heating temperature. Despite a difficulty of exactly knowing the amount of the alcohol to be removed, about 80% by mass or more of the alcohol produced is preferably removed.

Next, the acid catalyst used in the hydrolysis-condensation reaction may be removed from the reaction mixture. A method for removing acid catalyst is to mix water and the silicon-containing compound and extract the silicon-containing compound with organic solvent. As the organic solvent used, the one that can dissolve a silicon-containing compound and achieve two-layer separation by mixing with water is preferable. Illustrative example thereof includes methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, cyclopentyl methyl ether, and mixture thereof.

Moreover, mixture of water-soluble organic solvent and slightly water soluble organic solvent can be used. Illustrative example thereof includes methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, and ethylene glycol monopropyl ether+propylene glycol methyl ether acetate mixture, but is not restricted to combination of these mixtures.

The mixing ratio of the water-soluble organic solvent and the slightly water soluble organic solvent is determined accordingly. However, the water-soluble organic solvent is 0.1 to 1,000 parts by mass, preferably 1 to 500 parts by mass, and much more preferably 2 to 100 parts by mass, relative to 100 parts by mass of the slightly water soluble organic solvent.

Subsequently, the reaction mixture may be cleaned with neutral water. The neutral water may be water called deionized water or ultrapure water. The amount of the water is preferably 0.01 to 100 L, more preferably 0.05 to 50 L, and much more preferably 0.1 to 5 L, relative to 1 L of a silicon-containing compound solution. The method for cleaning the mixture is to charge both the reaction mixture and water into the same container, agitate them and then settled to separate a water layer. The number of cleaning may be once or more, and preferably once to 5 times because cleaning 10 or more times is not worth to have full effects thereof.

Other methods for removing acid catalyst include a method by ion-exchange resin, and a method for removing acid catalyst after neutralization with an epoxy compound such as ethylene oxide and propylene oxide. These methods can be selected arbitrarily according to the kind of acid catalyst used in the reaction.

In this operation of water-cleaning, number of cleaning and amount of water for cleaning may be determined arbitrarily in view of effects of catalyst removal and fractionation because there is a case that a part of the silicon-containing compound escapes into a water layer, thereby substantially the same effect as fractionation operation is obtained.

As to both a silicon-containing compound having residual acid catalyst and a silicon-containing compound solution having no more acid catalyst, final solvent is added thereto and solvent is exchanged under reduced pressure to obtain a desired silicon-containing compound solution. The temperature for solvent exchange is preferably in the range of 0 to 100° C., more preferably 10 to 90° C., and much more preferably 15 to 80° C., though it is depending on the kinds of the reaction solvent and the extracting solvent to be removed. The decompression degree is preferably an atmospheric pressure or less, more preferably 80 kPa or less in the absolute pressure, and much more preferably 50 kPa or less in the absolute pressure, though it is depending on the kinds of the extracting solvent to be removed, of an exhausting equipment, and of a condensing apparatus as well as heating temperature.

In this operation, sometimes the silicon-containing compound may become unstable because of change of the solvent. This occurs due to compatibility of the silicon-containing compound with the final solvent; and thus, in order to prevent this from occurring, monovalent, divalent, or more polyvalent alcohol having cyclic ether as a substituent described in Japanese Patent Laid-Open Publication No. 2009-126940 paragraphs [0181] to [0182] may be added thereto as a stabilizer. The amount to be added is in the range of 0 to 25 parts by mass, preferably 0 to 15 parts by mass, and more preferably 0 to 5 parts by mass, or 0.5 parts by mass or more when it is added, relative to 100 parts by mass of a silicon-containing compound in a solution before solvent exchange. Monovalent, divalent, or more polyvalent alcohol having cyclic ether as a substituent may be added to a solution, as required, before the solvent exchange.

The concentration of the silicon-containing compound is preferably in the range of 0.1 to 20% by mass. If the silicon-containing compound is concentrated with 20% by mass or less, the concentration can be maintained at a proper level. Therefore, it is prevented from occurring that condensation reaction further proceeds and the silicon-containing compound changes to the form cannot be redissoluted in organic solvent. In addition, if the concentration is 0.1% or more, the amount of solvent is not too large; therefore it is economical.

Preferable example of the final solvent added to the silicon-containing compound includes alcohol solvent, and particularly monoalkyl ether such as ethylene glycol, diethylene glycol, triethylene glycol, propylene glycol, dipropylene glycol, butanediol, and derivative thereof. Illustrative example thereof includes butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether.

With these solvents as a main component, non-alcohol solvent can be added as co-solvent. Illustrative example of the co-solvent includes acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, and cyclopentyl methyl ether.

In another operation by using acid catalyst, water or water-containing organic solvent is added to a monomer or an organic solution of a monomer to start hydrolysis reaction. The catalyst may be added to a monomer or an organic solution of a monomer, or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

The organic solvent is preferably a water-soluble solvent, and illustrative example thereof includes polyvalent alcohol condensate derivative such as methanol, ethanol, 1-propanol, 2-propanol, 1-butanol, 2-butanol, 2-methyl-1-propanol, acetone, tetrahydrofuran, acetonitrile, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, and a mixture thereof.

The amount of the organic solvent used may be the same as before. A reaction mixture obtained is post-treated like the method as mentioned above to obtain a silicon-containing compound.

The silicon-containing compound can be produced by hydrolysis and/or condensation of the monomers in the presence of base catalyst. Illustrative example of the base catalyst used includes methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of the catalyst used is preferably in the range of $1\times10^{-6}$ mole to 10 moles, more preferably $1\times10^{-5}$ mole to 5 moles, and much more preferably $1\times10^{-4}$ mole to 1 mole, per mole of a silicon monomer(s).

The amount of water for obtaining a silicon-containing compound by hydrolysis and/or condensation of the above monomers is preferably in the range of 0.1 to 50 moles, per mole of a hydrolyzable substituent bonded to the monomer. If the amount is 50 moles or less, a device used for the reaction becomes smaller and more economical.

In operation, a monomer(s) is/are added to catalyst aqueous solution to start hydrolysis and condensation reaction. Organic solvent may be added to the catalyst aqueous solution, and a monomer(s) may be diluted with organic solvent, or both may be performed. The reaction temperature is preferably in the range of 0 to 100° C., and more preferably 5 to 80° C. A method for maintaining the temperature at 5 to 80° C. when a monomer is dropped and then aging the mixture at 20 to 80° C. is preferable.

The organic solvent that can be added to the base catalyst aqueous solution or can dilute the monomer is preferably an illustrative example of the organic solvent that can be added to the acid catalyst aqueous solution. The amount of the organic solvent used is preferably in the range of 0 to 1,000 ml, per mole of a monomer(s), due to economical reaction.

Then, if necessary, the catalyst is subjected to neutralization reaction and alcohol produced by hydrolysis-condensation reaction is removed under reduced pressure to obtain a reaction mixture aqueous solution. The amount of an acid substance to be used for neutralization is preferably in the range of 0.1 to 2 equivalent weight, relative to basic substance used as the catalyst. The acid substance may be optionally selected if it is acid in water.

Subsequently, it is preferable that a by-product such as alcohol produced by hydrolysis-condensation reaction from the reaction mixture be removed under reduced pressure. The temperature for heating the reaction mixture is preferably in the range of 0 to 100° C., more preferably 10 to 90° C., and much more preferably 15 to 80° C., though it is depending on the kinds of the organic solvent added and the alcohol produced by reaction. The decompression degree is preferably an atmospheric pressure or less, more preferably 80 kPa or less in the absolute pressure, and much more preferably 50 kPa or less in the absolute pressure, though it is depending on the kinds of the organic solvent and the alcohol to be removed, of an exhausting equipment, an of a condensing apparatus as well as heating temperature. Despite a difficulty of exactly knowing the amount of the alcohol to be removed, about 80% by mass or more of the alcohol produced is preferably removed.

Next, to remove the catalyst used in the hydrolysis-condensation reaction, the silicon-containing compound is extracted with organic solvent. As the organic solvent used, the one that can dissolve a silicon-containing compound and achieve two-layer separation by mixing with water is preferable. Illustrative example thereof includes methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, cyclopentyl methyl ether, and a mixture thereof.

Next, to remove the base catalyst used in the hydrolysis-condensation reaction, the silicon-containing compound is extracted with organic solvent. As the organic solvent used, the one that can dissolve a silicon-containing compound and achieve two-layer separation by mixing with water is preferable.

Moreover, mixture of water-soluble organic solvent and slightly water soluble organic solvent can be used.

Illustrative example of the organic solvent used for removing the base catalyst includes the above-mentioned organic solvent for removing the acid catalyst, and mixture of water-soluble organic solvent and slightly water soluble organic solvent.

The mixing ratio of the water-soluble organic solvent and the slightly water soluble organic solvent is determined accordingly. However, the water-soluble organic solvent is preferably 0.1 to 1,000 parts by mass, more preferably 1 to 500 parts by mass, and much more preferably 2 to 100 parts by mass, relative to 100 parts by mass of the slightly water soluble organic solvent.

Subsequently, the reaction mixture may be cleaned with neutral water. The neutral water may be water called deionized water or ultrapure water. The amount of the water is preferably 0.01 to 100 L, more preferably 0.05 to 50 L, and much more preferably 0.1 to 5 L, relative to 1 L of a silicon-containing compound solution. The method for cleaning the mixture is to charge both the reaction mixture and water into the same container, agitate them and then settled to separate a water layer. The number of cleaning may be once or more, and preferably once to 5 times because cleaning 10 or more times is not worth to have full effects thereof.

Final solvent is added to the cleaned silicon-containing compound solution and solvent is exchanged under reduced pressure to obtain a desired silicon-containing compound solution. The temperature for solvent exchange is preferably in the range of 0 to 100° C., more preferably 10 to 90° C., and much more preferably 15 to 80° C., though it is depending on the kinds of the reaction solvent and the extracting solvent to be removed. The decompression degree is preferably an atmospheric pressure or less, more preferably 80 kPa or less in the absolute pressure, and much more preferably 50 kPa or less in the absolute pressure, though it is depending on the kinds of the extracting solvent to be removed, of an exhausting equipment, and of a condensing apparatus as well as heating temperature.

Preferable example of the final solvent added to the silicon-containing compound includes alcohol solvent, and particularly monoalkyl ether such as ethylene glycol, diethylene glycol, and triethylene glycol, propylene glycol and dipropylene glycol. Illustrative example thereof includes propylene glycol monomethyl ether, ethylene glycol monomethyl ether, propylene glycol monoethyl ether, ethylene glycol monoethyl ether, propylene glycol monopropyl ether, and ethylene glycol monopropyl ether.

In another operation by using base catalyst, water or water-containing organic solvent is added to a monomer or an organic solution of a monomer to start hydrolysis reaction. The catalyst may be added to a monomer or an organic solution of a monomer, or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

The organic solvent is preferably a water-soluble solvent, and illustrative example thereof includes polyvalent alcohol condensate derivative such as methanol, ethanol, 1-propanol, 2-propanol, 1-butanol, 2-butanol, 2-methyl-1-propanol, acetone, tetrahydrofuran, acetonitrile, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, and mixture thereof.

The molecular weight of the silicon-containing compound obtained can be adjusted not only by selecting a monomer, but also controlling reaction conditions during polymerization. The average molecular weight is preferably 100,000 or less, more preferably 200 to 50,000, and much more preferably 300 to 30,000. If the average molecular weight is 100,000 or less, the silicon-containing compound could preferably show no foreign object or coating spot.

The above average molecular weight is obtained as data, in terms of polystyrene as a reference material, by means of gel-permeation chromatography (GPC) by using RI as a detector and tetrahydrofuran as an eluant.

The composition for forming a silicon-containing resist under layer film of the present invention contains the silicon-containing compound ($A_1$) obtained by hydrolysis, condensation or hydrolysis-condensation of the silicon compound (A-1), or a mixture of the silicon compound (A-1) and the silicon compound (A-2) as a base polymer as mentioned above, and further, the silicon-containing compound ($A_2$) obtained by using the silicon compound (A-2) alone as a monomer may be added as a base polymer.

For optimizing pattern adhesiveness or optical performance, a tri-functional silicon compound (a silicon compound having three hydrolyzable groups per a silicon atom) has heretofore been widely used. However, it has been known that the tri-functional silicon compound forms the cage compound which is considered to be a causative substance of coating defects as mentioned above, so that for fundamental suppression of the coating defects, pattern adhesiveness or optical performance must be optimized without using the tri-functional silicon compound. As a composition produced by using a disiloxane compound (w=0 in the present invention) as a starting material, there is disclosed in Japanese Patent Laid-Open Publication No. 2004-191386 or Japanese Patent Laid-Open Publication No. 2004-157469, but there is no description about the coating defects therein, and a different substance from the silicon compound used in the present invention (in particular, a silicon compound (A-1)) is used; so that it cannot be expected to achieve both of the decrease of the coating defects and excellent pattern adhesiveness or optical performance as in the present invention.

In the present invention, a silicon compound other than the tri-functional silicon compound, i.e., the silicon compound (A-1) is used as a primary monomer, whereby the generation of the cage compound in the composition can be suppressed, and the composition for forming a silicon-containing resist under layer film with extremely little number of coating defects can be obtained.

In addition, the composition for forming a silicon-containing resist under layer film of the present invention may contain a polymer(s) other than the above-mentioned polymers, which further improves pattern adhesiveness or etching selectivity, if desired. Moreover, for improving various characteristics of the composition for forming a silicon-containing resist under layer film, the components exemplified below may be added to the composition.

[Other Components]

A thermal crosslinking accelerator may be added to the composition for forming a silicon-containing resist under layer film of the present invention. As the thermal crosslinking accelerator, a material described in Japanese Patent Laid-Open Publication No. 2007-302873 can be used.

The above thermal crosslinking accelerator can be used alone or in combination with two or more kinds thereof. The amount of the thermal crosslinking accelerator to be added is preferably in the range of 0.01 to 50 parts by mass, more preferably 0.1 to 40 parts by mass, relative to 100 parts by mass of the base polymer.

To improve the stability of the composition for forming a silicon-containing resist under layer film of the present invention, monovalent, divalent, or more polyvalent organic acid having 1 to 30 carbon atoms is preferably added. Illustrative example of the acid to be added includes formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid, and particularly preferable example includes oxalic acid, maleic acid, formic acid, acetic acid, propionic acid, and citric acid. To maintain the stability, two or more kinds of the acids may be mixed. The amount of the acid to be added is preferably in the range of 0.001 to 25 parts by mass, more preferably 0.01 to 15 parts by mass, and much more preferably 0.1 to 5 parts by mass, relative to 100 parts by mass of silicon contained in the base polymer.

Also, the organic acid is preferably added, so that pH of the composition having the organic acid preferably satisfies 0≤pH≤7, more preferably 0.3≤pH≤6.5, much more preferably 0.5≤pH≤6.

Water may be added to the composition for forming a silicon-containing resist under layer film of the present invention. Water addition hydrates a silicon-containing compound in the composition and improves lithography performance. The water content in the solvent component of the composition is preferably exceeds 0% by mass and under 50% by mass, more preferably 0.3 to 30% by mass, and much more preferably 0.5 to 20% by mass. Each component, if its water content is under 50% by mass, can improve the uniformity of the coating film, preferably resulting in no eye hole.

The amount of all solvents containing water used is preferably 100 to 100,000 parts by mass, particularly 200 to 50,000 parts by mass, relative to 100 parts by mass of the base polymer.

A photo-acid generator may be added to the composition for forming a silicon-containing resist under layer film of the present invention. Illustrative example of the photo-acid generator used in the present invention includes a material described in Japanese Patent Laid-Open Publication No. 2009-126940 paragraphs [0160] to [0179].

Moreover, as a stabilizer, monovalent, divalent, or more polyvalent alcohol having cyclic ether as a substituent group may be added to the composition for forming a silicon-containing resist under layer film of the present invention. By adding the stabilizer, stability of the composition can be improved. Illustrative example of the stabilizer includes a material described in Japanese Patent Laid-Open Publication No. 2009-126940 paragraphs [0126] to [0127].

Moreover, a surfactant can be blended into the composition for forming a silicon-containing resist under layer film of the present invention as required. Illustrative example of the surfactant includes a material described in Japanese Patent Laid-Open Publication No. 2009-126940 paragraph [0129].

When such a composition for forming a silicon-containing resist under layer film is employed, a silicon-containing resist under layer film having extremely less number of coating defects and excellent in pattern adhesiveness and etching selectivity can be formed.

Patterning Process

As one of the embodiments of the patterning process of the present invention using the composition for forming a silicon-containing resist under layer film prepared as mentioned above, there may be mentioned a patterning process which comprises the steps of: forming an organic under layer film on a body to be processed using a coating type organic under layer film material; forming a silicon-containing resist under layer film on the organic under layer film using the above-mentioned composition for forming a silicon-containing resist under layer film; forming an upper layer resist film on the silicon-containing resist under layer film using an upper layer resist film composition; forming an upper layer resist pattern to the upper layer resist film; transferring the pattern to the silicon-containing resist under layer film by etching using the upper layer resist pattern as a mask; transferring the pattern to the organic under layer film by etching using the silicon-containing resist under layer film to which the pattern has been transferred as a mask; and further transferring the pattern to the body to be processed by etching using the organic under layer film to which the pattern has been transferred as a mask.

Also, as another embodiment of the patterning process of the present invention, there may be mentioned a patterning process which comprises the steps of: forming an organic hard mask mainly comprising carbon on a body to be processed by a CVD method; forming a silicon-containing resist under layer film on the organic hard mask using the above-mentioned composition for forming a silicon-containing resist under layer film; forming an upper layer resist film on the silicon-containing resist under layer film using an upper layer resist film composition; forming an upper layer resist pattern to the upper layer resist film; transferring the pattern to the silicon-containing resist under layer film by etching using the upper layer resist pattern as a mask; transferring the pattern to the organic hard mask by etching using the silicon-containing resist under layer film to which the pattern has been transferred as a mask; and further transferring the pattern to the body to be processed by etching using the organic hard mask to which the pattern has been transferred as a mask.

Here, as the body to be processed, a semiconductor substrate or a material in which any of a metal film, a metal carbide film, a metal oxide film, a metal nitride film, a metal oxycarbide film or a metal oxynitride film is formed as a layer to be processed (a portion to be processed) on the semiconductor substrate, etc., may be used.

As the semiconductor substrate, a silicon substrate is generally used, but it is not particularly limited, and a material such as Si, amorphous silicon (α-Si), p-Si, $SiO_2$, SiN, SiON, W, TiN, Al, etc., and different in the material from the layer to be processed may be used.

Also, as a metal constituting the body to be processed (including the semiconductor substrate), any of silicon, titanium, tungsten, hafnium, zirconium, chromium, germanium, copper, aluminum, indium, gallium, arsenic, palladium, iron, tantalum, iridium or molybdenum, or an alloy thereof may be used, and as the layer to be processed containing such a metal may be used, for example, Si, $SiO_2$, SiN, SiON, SiOC, p-Si, α-Si, TiN, WSi, BPSG, SOG, Cr, CrO, CrON, MoSi, W, W—Si, Al, Cu, Al—Si, etc., and various low dielectric films and an etching stopper film thereof, which can be generally formed with a thickness of 50 to 10,000 nm, particularly 100 to 5,000 nm.

In the patterning process of the present invention, an organic under layer film or an organic hard mask can be formed on the body to be processed. Among these, the organic under layer film can be formed by using a spin-coating method, etc., with a coating type organic under layer film material, and the organic hard mask can be formed by using a CVD method with a material of the organic hard mask mainly comprising carbon. Such an organic under layer film or an organic hard mask is not particularly limited, and when the upper layer resist film is subjected to pattern formation by exposure, those which show a sufficient function as an anti-reflection film are preferred. By forming such an organic under layer film or an organic hard mask, the pattern formed at the upper layer resist film can be transferred onto the body to be processed without causing difference in size conversion.

The silicon-containing resist under layer film to be used in the patterning process of the present invention can be formed on the body to be processed by a spin-coating method, etc., with a composition for forming a silicon-containing resist under layer film. When it is formed by the spin-coating method, it is desirable to bake the material after spin-coating, to promote the cross-linking reaction for the purpose of evaporating the solvent and preventing mixing with the upper layer resist film. The baking temperature is preferably in the range of 50 to 500° C., and the baking time is preferably in the range of 10 to 300 seconds. At this time, the temperature is particularly preferably 400° C. or less to reduce thermal damage to the device, though it is depending on the structure of the device to be manufactured.

Further, in the patterning process of the present invention, as a method for forming a pattern to the upper layer resist film, any of the methods selected from a lithography method using light having a wavelength of 300 nm or less or EUV light, an electron beam direct drawing method, a directed self-assembly method (the so-called DSA method) and a nano-imprinting lithography method may be suitably used. By using such a method, a fine pattern can be formed on the resist upper layer film.

The upper layer resist film composition may be optionally selected depending on the above-mentioned method of forming a pattern to the upper layer resist film. For example, when lithography using light of 300 nm or less or EUV light is carried out, a chemically amplified photoresist film material can be used as the upper layer resist film composition. Such a photoresist film material may be exemplified by a material in which a positive type pattern is formed by forming a photoresist film, exposing the same, and dissolving the exposed portion using an alkaline developing solution, or a material in which a negative type pattern is formed by dissolving an unexposed portion using a developing solution comprising an organic solvent.

When the exposure process in the present invention is to be made an exposure process using ArF excimer laser light, for example, as the photoresist film at the upper layer, any of the usual resist compositions for ArF excimer laser light may be used. Many candidates have already been known as the resist compositions for the ArF excimer laser light. When the already known resins are roughly classified, there are a poly(meth)acrylic series, a COMA (Cyclo Olefin Maleic Anhydride) series, a COMA-(meth)acrylic hybrid series, an ROMP (Ring Opening Metathesis Polymerization) series, a polynorbornene series, etc. Among these, the resist composition using the poly(meth)acrylic series resin assures etching resistance thereof by introducing an alicyclic skeleton at the side chain, so that its resolution performance is excellent as compared to that of the other resin series, whereby it can be preferably used.

The patterning process of the present invention causes extremely less coating defects of the silicon-containing resist under layer film, and also excellent in pattern adhesiveness to the upper layer resist film or etching selectivity to the upper layer resist film and the organic film (an organic under layer film, an organic hard mask, etc.), so that fine pattern formed to the upper layer resist film can be transferred to the lower layer without defects and without difference in size conversion, and finally the body to be processed can be processed without defects in pattern transferring whereby it can improve yield.

EXAMPLES

In the following, the present invention is explained in more specifically by referring to Synthesis Examples, Preparation Examples, Comparative Preparation Examples, Examples, and Comparative Example, but the present invention is not limited by these descriptions. Incidentally, in the following examples, % means % by mass and the molecular weight measurement was carried out by using GPC.

Synthesis of Silicon Compounds (A-1)

Synthesis Example 1

Synthesis of Silicon Compound 1

In a 500 ml four-necked flask made of a glass and equipped with a thermometer, a Dimroth condenser made of a glass, a mechanical stirrer and a dropping funnel were charged 30 g of hexamethoxy disiloxane and 100 ml of tetrahydrofuran (THF), and under nitrogen atmosphere, to the mixture was added dropwise 100 ml of a THF solution containing 13 g of phenylmangesium chloride while controlling the dropping rate so that an inner temperature of the flask maintains at 45° C. After completion of the dropwise addition, the mixture was refluxed for one hour under stirring. Thereafter, the temperature of the mixture was returned to normal temperature, 200 g of hexane was added to the mixture, and the deposited salt was removed by filtration, and the low boiling point component was removed by distillation. The residue was further purified by distillation to obtain 20 g (Yield: 70%) of a silicon compound 1 shown below.

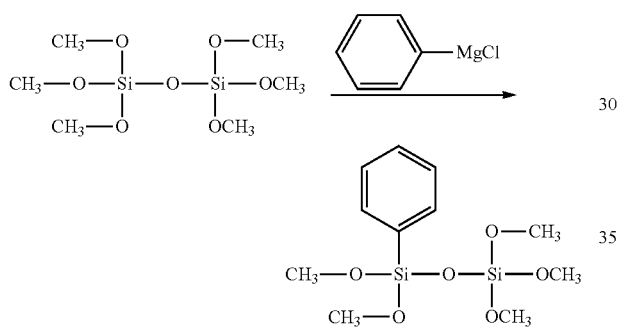

Synthesis Example 2

Synthesis of Silicon Compound 2

In a 2,000 ml four-necked flask made of a glass and equipped with a thermometer, a Dimroth condenser made of a glass, a mechanical stirrer and a dropping funnel were charged 120 g of tetramethoxy disiloxane, 600 ml of toluene and 5 g of chloroplatinic acid, and under nitrogen atmosphere, to the mixture was added dropwise 120 g of tertiary-butyl 5-norbornene-2-carboxylate while controlling the dropping rate so that an inner temperature of the flask maintains at 70° C. to 80° C. After completion of the dropwise addition, the mixture was further stirred at 80° C. for one hour to complete the reaction whereby the silicon compound shown below was obtained.

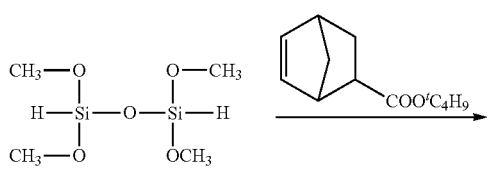

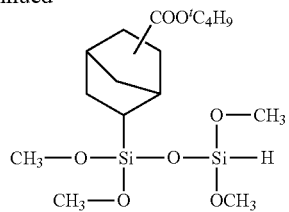

Next, when the inner temperature of the flask was lowered to 30° C., 30 g of methanol was added to the mixture, and the resulting mixture was stirred at the same temperature for one hour. The obtained reaction mixture was purified by distillation to obtain 150 g (Yield: 60%) of a silicon compound 2 shown below.

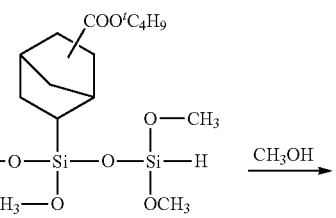

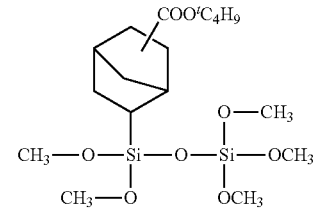

Preparation of Silicon-Containing Compounds

Preparation Example 1

To a mixture comprising 200 g of methanol, 0.1 g of methanesulfonic acid and 60 g of deionized water was added a mixture comprising 7.6 g of the silicon compound 1 and 68.5 g of tetramethoxy silane, and the resulting mixture was maintained at 40° C. for 12 hours to carry out hydrolysis-condensation. After completion of the reaction, 300 g of propylene glycol ethyl ether (PGEE) was added to the reaction mixture, and by-produced alcohol was distilled off under reduced pressure to obtain 320 g (compound concentration: 10%) of a PGEE solution of a silicon-containing compound 1-1. When the molecular weight of the product in terms of polystyrene was measured, it was Mw=1,900.

Preparation Example 2

To a mixture comprising 200 g of methanol, 0.1 g of methanesulfonic acid and 60 g of deionized water was added a mixture comprising 52.8 g of Silicon compound 2 and 38.1 g of tetramethoxy silane, and the resulting mixture was maintained at 40° C. for 12 hours to carry out hydrolysis-condensation. After completion of the reaction, 500 g of PGEE was added to the reaction mixture, and by-produced alcohol was distilled off under reduced pressure to obtain 530 g (compound concentration: 10%) of a PGEE solution of a silicon-containing compound 1-2. When the molecular weight of the product in terms of polystyrene was measured, it was Mw=1,700.

Comparative Preparation Example 1

To a mixture comprising 200 g of methanol, 0.1 g of methanesulfonic acid and 60 g of deionized water was added a mixture comprising 5.0 g of phenyl trimethoxy silane and 72.3 g of tetramethoxy silane, and the resulting mixture was maintained at 40° C. for 12 hours to carry out hydrolysis-condensation. After completion of the reaction, 300 g of PGEE was added to the reaction mixture, and by-produced alcohol was distilled off under reduced pressure to obtain 320 g (compound concentration: 10%) of a PGEE solution of a silicon-containing compound 1-3. When the molecular weight of the product in terms of polystyrene was measured, it was Mw=2,000.

Comparative Preparation Example 2

To a mixture comprising 200 g of methanol, 0.1 g of methanesulfonic acid and 60 g of deionized water was added a mixture comprising 39.6 g of the silicon compound 3 shown below and 57.1 g of tetramethoxy silane, and the resulting mixture was maintained at 40° C. for 12 hours to carry out hydrolysis-condensation. After completion of the reaction, 500 g of PGEE was added to the reaction mixture, and by-produced alcohol was distilled off under reduced pressure to obtain 530 g (compound concentration: 10%) of a PGEE solution of a silicon-containing compound 1-4. When the molecular weight of the product in terms of polystyrene was measured, it was Mw=2,000.

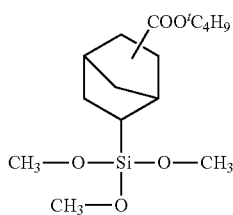

Preparation of Compositions for Forming a Silicon-Containing Resist Under Layer Film and Formation of Silicon-Containing Resist Under Layer Films Example 1

160 g of a 10% by weight PGEE solution of the silicon-containing compound 1-1, 640 g of PGEE and 80 g of deionized water were mixed, uniformized by stirring, and subjected to circulation filtration by a filter made of a polyethylene having an aperture of 2 nm with a flow rate of 10 ml per minute for 30 hours to prepare a composition for forming a silicon-containing resist under layer film. Next, the composition was filled in a clean vessel, subsequently spin-coated on a silicon wafer by using Clean Track ACT12 (manufactured by Tokyo Electron Limited) with 1500 rpm, and heated at 240° C. for 60 seconds to prepare a coating film with a film thickness of 35 nm. As to the surface defects (coating defects) of the coating film, a number of coating defects of 60 nm or more was measured by a dark-field defect detecting apparatus SP-2 (manufactured by KLA-Tencor Corporation). The results are shown in Table 1.

Example 2

In the same manner as in Example 1 except for using 160 g of a 10% by weight PGEE solution of the silicon-containing compound 1-2, a coating film was prepared. Coating defects thereof were measured by counting a number of the coating defects in the same manner as in Example 1. The results are shown in Table 1.

Comparative Example 1

In the same manner as in Example 1 except for using 160 g of a 10% by weight PGEE solution of the silicon-containing compound 1-3, a coating film was prepared. Coating defects thereof were measured by counting a number of the coating defects in the same manner as in Example 1. The results are shown in Table 1.

Comparative Example 2

In the same manner as in Example 1 except for using 160 g of a 10% by weight PGEE solution of the silicon-containing compound 1-4, a coating film was prepared. Coating defects thereof were measured by counting a number of the coating defects in the same manner as in Example 1. The results are shown in Table 1.

TABLE 1

|  | Number of the coating defects |
| --- | --- |
| Example 1 | 20 |
| Example 2 | 10 |
| Comparative Example 1 | 300 |
| Comparative Example 2 | 350 |

When a film was formed by the compositions for forming a silicon-containing resist under layer film of Examples 1 and 2 prepared by using the silicon compound (A-1), it could be shown that coating defects were extremely little as compared to Comparative Examples 1 and 2 which did not use the same compound.

Patterning Test by Positive Type Development

On a silicon wafer, a spin-on carbon film ODL-50 (manufactured by Shin-Etsu Chemical Co., Ltd.: carbon content; 80% by mass) was formed with a film thickness of 200 nm. The composition for forming a silicon-containing resist under layer film of Example 1 or Comparative Example 1 was each coated thereon and heated at 240° C. for 60 seconds to prepare each of the silicon-containing resist under layer film with a film thickness of 35 nm. Subsequently, the ArF resist solution (PR-1) for positive type development described in Table 2 was coated, and baked at 110° C. for 60 seconds to form a photoresist layer with a film thickness of 100 nm. Further, the liquid immersion protective film (TC-1) described in Table 3 was coated on the photoresist film and baked at 90° C. for 60 seconds to form a protective film with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 50 nm 1:1 positive type line and space pattern. Then, this line and space pattern was used as a mask, dry etching was carried out under the condition (1) to transfer the pattern to the silicon-containing resist under layer film.

TABLE 2

| No. | Polymer (parts by mass) | Acid generator (parts by mass) | Base (parts by mass) | Solvent (parts by mass) |
|---|---|---|---|---|
| PR-1 | ArF resist polymer 1 (100) | PAG1 (7.0) | Quencher (1.0) | PGMEA (2,500) |

ArF resist polymer 1:
Molecular weight (Mw) = 7,800
Dispersity (Mw/Mn) = 1.78

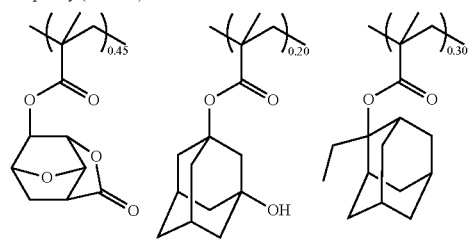

Acid generator: PAG1

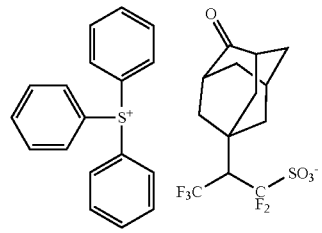

Base: Quencher

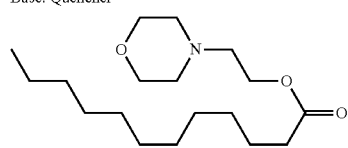

TABLE 3

| | Polymer (parts by mass) | Organic solvent (parts by mass) |
|---|---|---|
| TC-1 | Protective film polymer (100) | Diisoamyl ether (2700) 2-Methyl-1-butanol (270) |

Protective film polymer:
Molecular weight (Mw) = 8,800
Dispersity (Mw/Mn) = 1.69

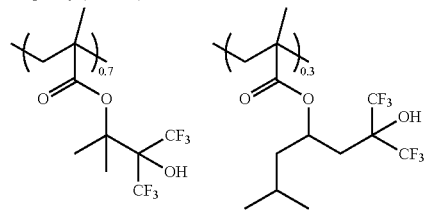

(1) Etching conditions in $CHF_3/CF_4$ type gas
Device: Dry etching device Telius SP (manufactured by Tokyo Electron Limited)
Etching Conditions (1):

| Chamber pressure | 10 Pa |
|---|---|
| Upper/Lower RF power | 500 W/300 W |
| $CHF_3$ gas flow amount | 50 ml/min |
| $CF_4$ gas flow amount | 150 ml/min |
| Ar gas flow amount | 100 ml/min |
| Treatment time | 40 sec |

The pattern obtained above was observed by a bright-field defect detecting apparatus KLA2800 (manufactured by KLA-Tencor Corporation), and a number of the pattern defects measured was shown in Table 4 (pattern defects).

TABLE 4

| | Number of the pattern defects |
|---|---|
| Example 1 | 5 |
| Comparative Example 1 | 50 |

Etching Test
Then, dry etching was carried out under the conditions (2) to transfer the pattern to the spin-on carbon filth. Pattern defects at the cross-sectional shape of the obtained pattern were observed and a number of the pattern defects measured was shown in Table 5 (pattern defects after etching).
(2) Etching Conditions in $O_2/N_2$ Type Gas
Device: Dry etching device Telius SP (manufactured by Tokyo Electron Limited)
Etching Conditions (2):

| Chamber pressure | 2 Pa |
|---|---|
| Upper/Lower RF power | 1000 W/300 W |
| $O_2$ gas flow amount | 300 ml/min |
| $N_2$ gas flow amount | 100 ml/min |
| Ar gas flow amount | 100 ml/min |
| Treatment time | 30 sec |

Number of Pattern Defects after Etching

TABLE 5

| | Number of pattern defects after etching |
|---|---|
| Example 1 | 3 |
| Comparative Example 1 | 20 |

It could be clarified that the patterning process using the composition for forming a silicon-containing resist under layer film of Example 1 with a little number of coating defects showed that pattern defects were extremely little as compared with that of Comparative Example 1, and pattern defects of the spin-on carbon film after dry etching were also extremely little.

From the results mentioned above, when the composition for forming a silicon-containing resist under layer film of the present invention is used, it can be clarified that a resist under layer film with extremely little coating defects can be formed, and such a resist under layer film is employed, it can be shown that the body to be processed can be processed with the state that pattern defects are reduced than those of the conventional ones.

It must be stated here that the present invention is not restricted to the embodiments shown by the above-mentioned embodiments. The above-mentioned embodiments are merely examples so that any embodiments composed of substantially the same technical concept as disclosed in the claims of the present invention and expressing a similar effect are included in the technical scope of the present invention.

What is claimed is:

1. A composition for forming a silicon-containing resist under layer film which comprises a polymeric silicon-containing compound ($A_1$) which is obtained by hydrolysis, condensation or hydrolysis-condensation of a silicon-containing composition (A-1) containing one or more compounds selected from the group consisting of (i) compounds having the following general formula (1) and (ii) compounds having the following formulae selected from (1'-a) to (1'-d),

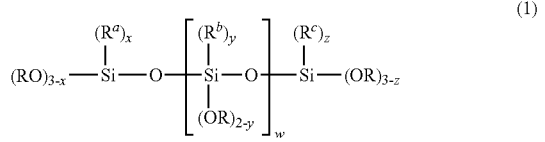

(1)

wherein R represents an organic group having 1 to 6 carbon atoms, $R^a$, $R^b$ and $R^c$ each represents a substituted or unsubstituted monovalent organic group having 1 to 30 carbon atoms, w=1, x=0, 1, 2 or 3, y=0, 1 or 2, z=0, 1, 2 or 3; and $7 \geq x+y+z \geq 1$, and the case where (x, y, z)=(1, 1, 1) is not included,

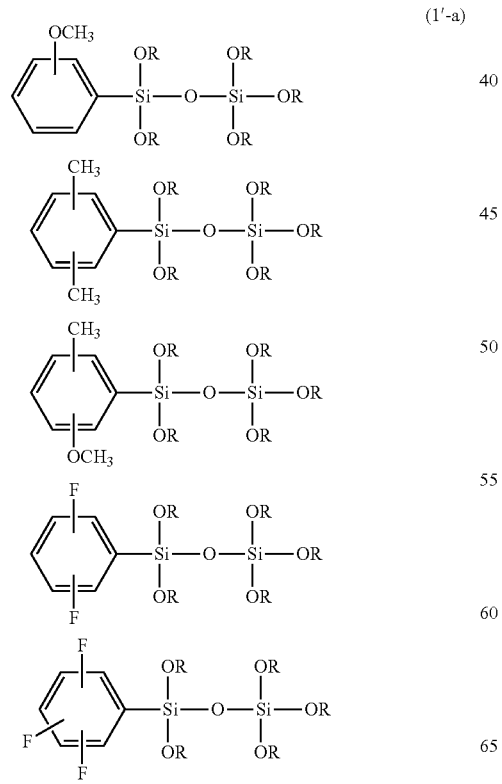

(1'-a)

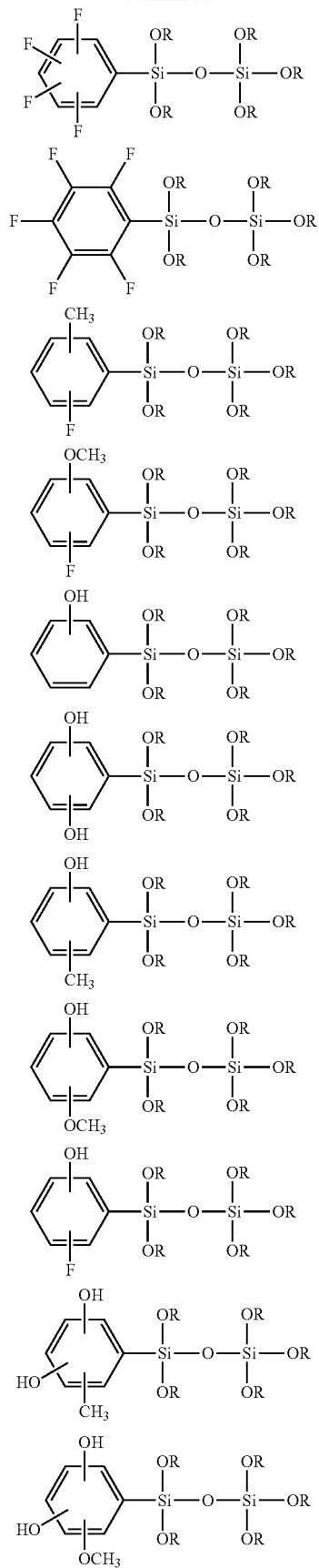

-continued
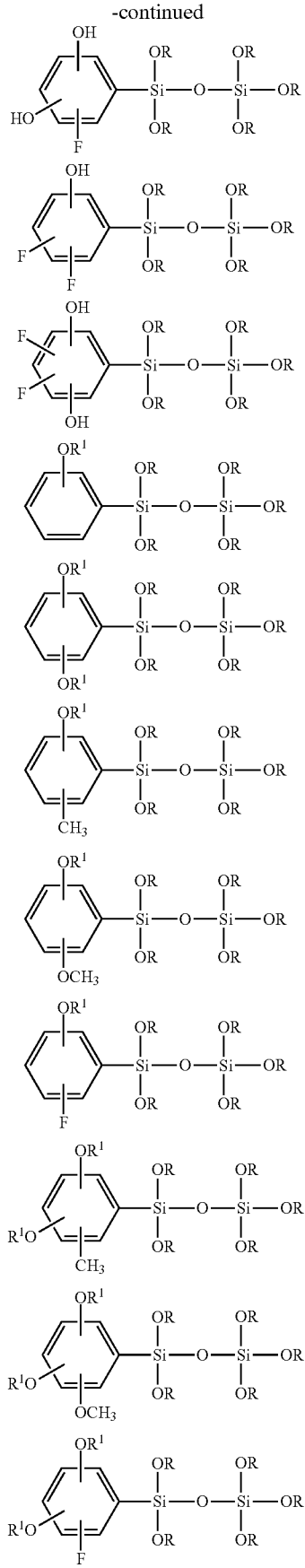
-continued
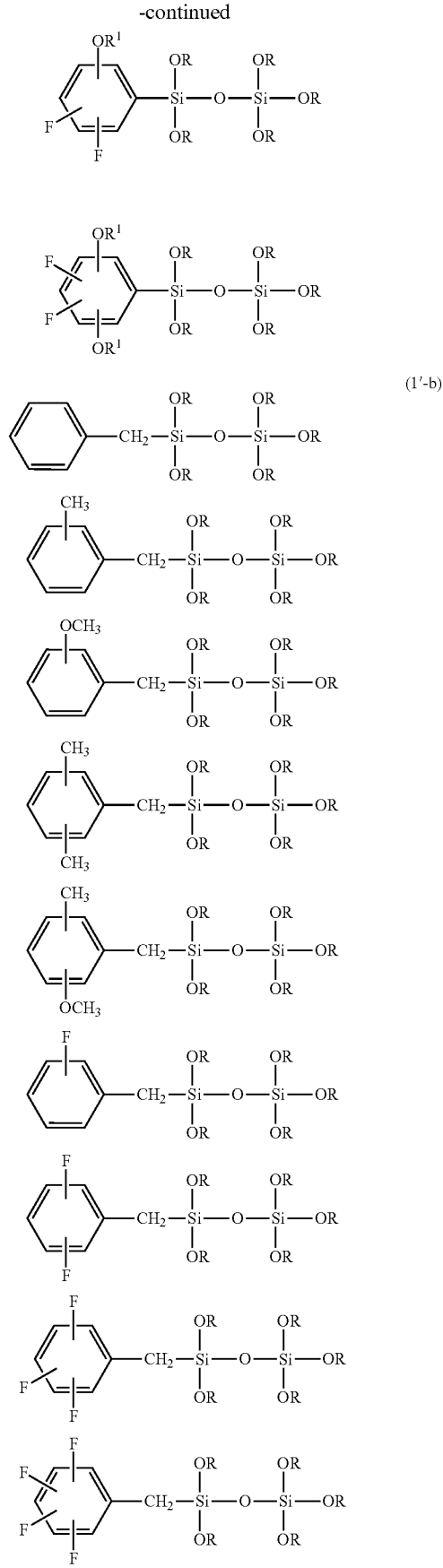
(1'-b)

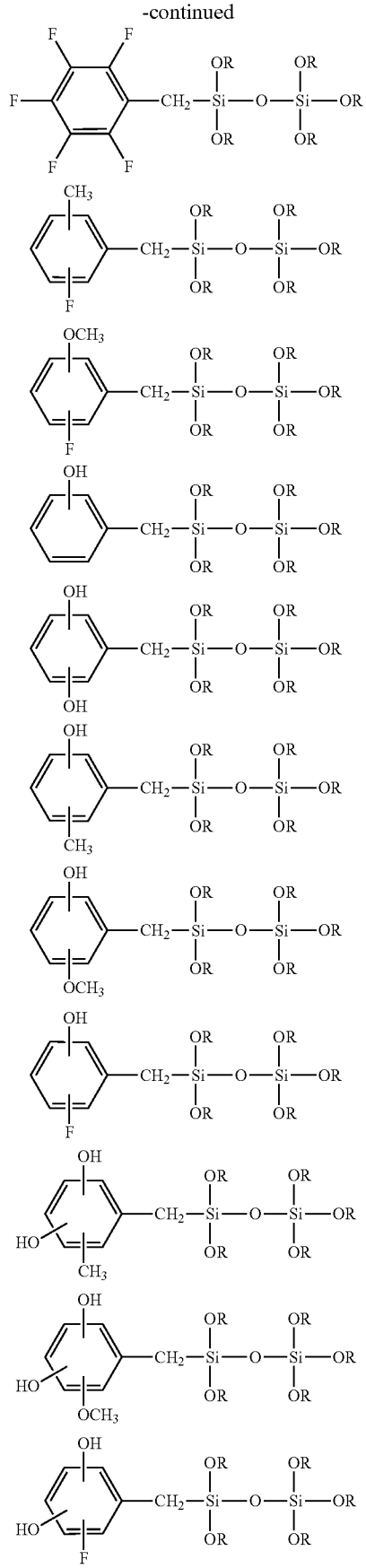
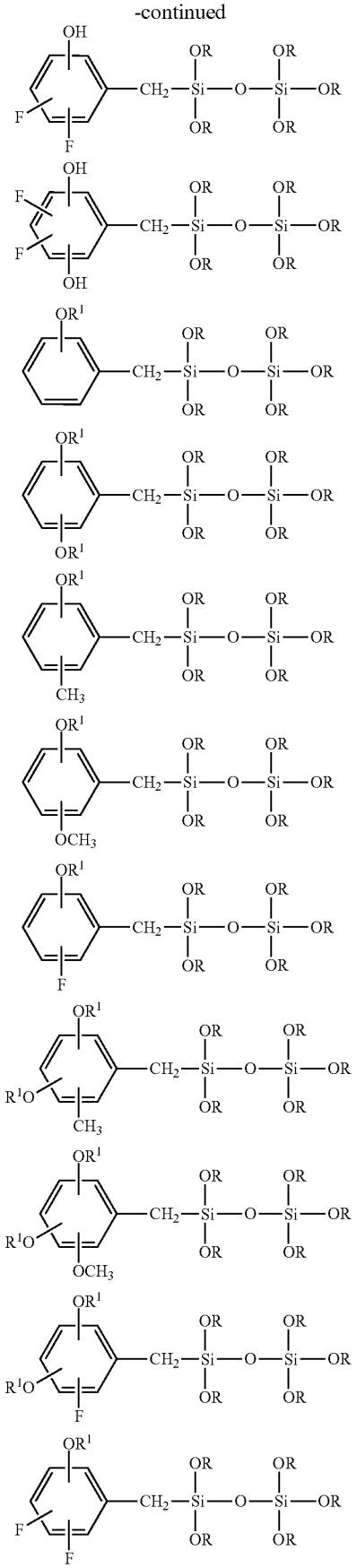

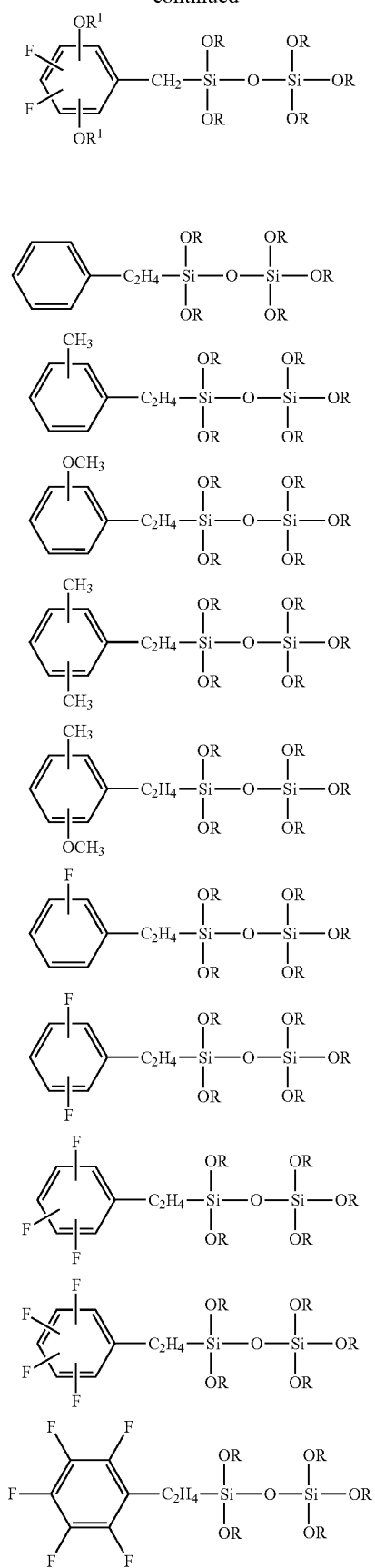
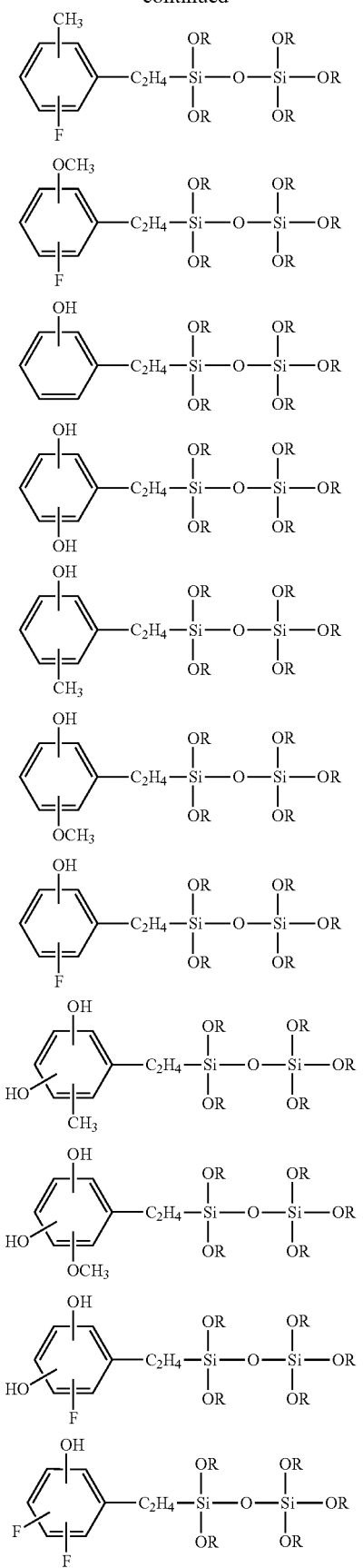

-continued

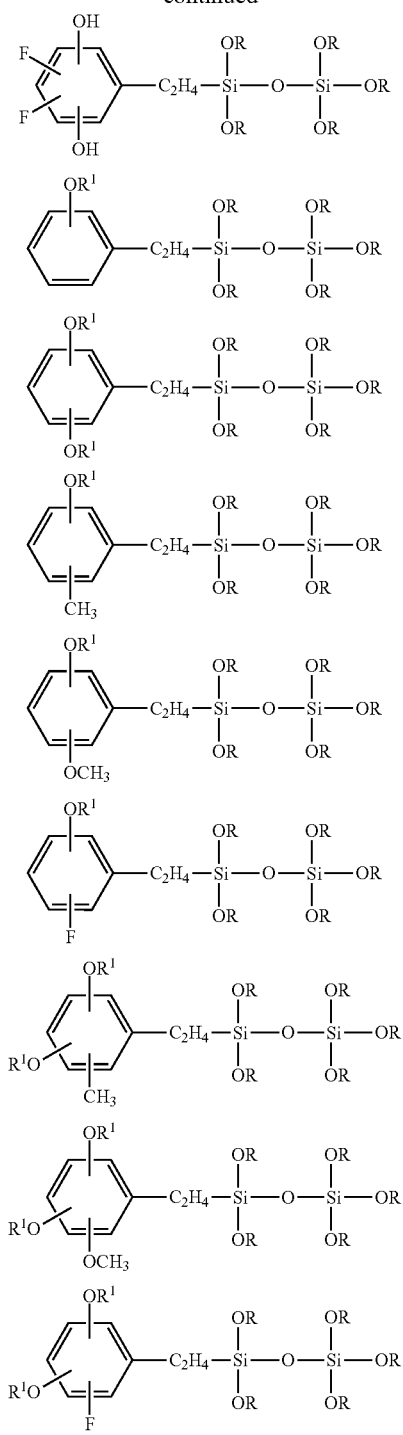

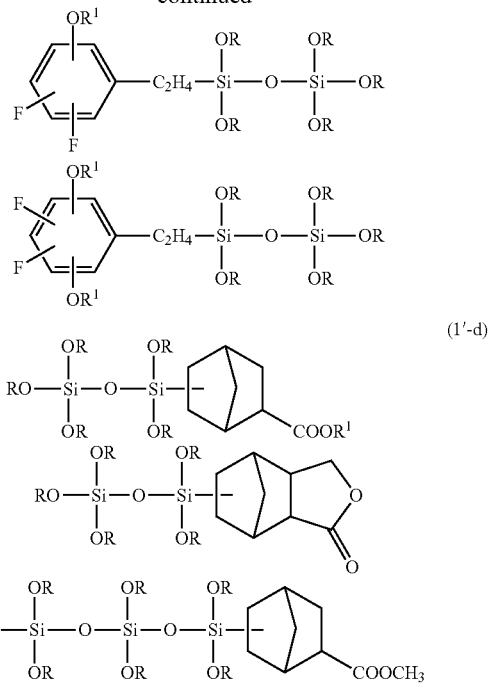

wherein R has the same meaning as defined above, and $R^1$ is a tertiary alkyl group.

2. The composition for forming a silicon-containing resist under layer film according to claim 1, wherein the polymeric silicon-containing compound ($A_1$) is obtained by hydrolysis, condensation or hydrolysis-condensation of a mixture of the silicon-containing composition (A-1) and one or more silicon compounds (A-2) having the following general formula (2), $$Si(OR)_4 \qquad (2)$$

wherein R has the same meaning as defined above.

3. The composition for forming a silicon-containing resist under layer film according to claim 1, wherein the composition further comprises a polymeric silicon-containing compound ($A_2$) which is obtained by hydrolysis, condensation or hydrolysis-condensation of one or more silicon compounds (A-2) having the following general formula (2), $$Si(OR)_4 \qquad (2)$$

wherein R has the same meaning as defined above.

4. The composition for forming a silicon-containing resist under layer film according to claim 2, wherein the composition further comprises a polymeric silicon-containing compound ($A_2$) which is obtained by hydrolysis, condensation or hydrolysis-condensation of one or more silicon compounds (A-2) having the following general formula (2), $$Si(OR)_4 \qquad (2)$$

wherein R has the same meaning as defined above.

* * * * *